United States Patent
Miyaji et al.

(10) Patent No.: US 6,940,346 B2
(45) Date of Patent: Sep. 6, 2005

(54) FEEDFORWARD AMPLIFIER, COMMUNICATION APPARATUS, FEEDFORWARD AMPLIFICATION METHOD, PROGRAM AND MEDIUM

(75) Inventors: Masayuki Miyaji, Kyoto (JP); Kaoru Ishida, Osaka (JP); Toshimitsu Matsuyoshi, Osaka (JP); Hisashi Adachi, Osaka (JP); Seiji Fujiwara, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 24 days.

(21) Appl. No.: 10/433,582
(22) PCT Filed: Nov. 30, 2001
(86) PCT No.: PCT/JP01/10469
§ 371 (c)(1), (2), (4) Date: Nov. 6, 2003
(87) PCT Pub. No.: WO02/50997
PCT Pub. Date: Jun. 27, 2002

(65) Prior Publication Data
US 2004/0075497 A1 Apr. 22, 2004

(30) Foreign Application Priority Data
Dec. 4, 2000 (JP) .................................. 2000-369147

(51) Int. Cl.[7] .............................. H03F 3/66; H03F 1/26
(52) U.S. Cl. ..................................... 330/52; 330/151
(58) Field of Search .......................... 330/52, 149, 151

(56) References Cited

U.S. PATENT DOCUMENTS

| | | | |
|---|---|---|---|
| 5,760,646 A | 6/1998 | Belcher et al. | 330/149 |
| 5,877,653 A | 3/1999 | Kim et al. | 330/149 |
| 6,011,434 A | 1/2000 | Sakai | 330/151 |
| 6,590,449 B2 * | 7/2003 | Matsuura et al. | 330/149 |

FOREIGN PATENT DOCUMENTS

| | | |
|---|---|---|
| DE | 197 20 019 A | 5/1998 |
| JP | 1-200807 | 8/1989 |
| JP | 09-298424 | 11/1997 |
| JP | 10-190361 | 7/1998 |
| JP | 10-284951 | 10/1998 |
| JP | 2000-151295 | 5/2000 |
| JP | 2000-216639 | 8/2000 |
| JP | 2000-223961 | 8/2000 |
| JP | 2000-512111 | 9/2000 |
| JP | 2001-53552 | 2/2001 |

OTHER PUBLICATIONS

International Search Report for PCT Application No. PCT/JP01/10469 dated Mar. 8, 2002.
Form PCT/ISA/210 English translation of above ISR dated Mar. 8, 2002.
European Search Report corresponding to application No. EP 01–27–1109 dated Oct. 5, 2004.

* cited by examiner

Primary Examiner—Steven J. Mottola
(74) Attorney, Agent, or Firm—RatnerPrestia

(57) ABSTRACT

The conventional feedforward amplifier is unable to suppress distortion components efficiently. The present invention provides a feedforward amplifier wherein the vector adjustor is adjusted so that (1) suppression is performed on only the distortion component generated within a predetermined frequency range out of the range of frequencies to be suppressed in which distortion components to be suppressed occur or (2) the suppression of the distortion component generated within the predetermined frequency range is greater than the suppression of the distortion component generated within the frequency range other than the predetermined frequency range out of the range of frequencies to be suppressed, and the pre-distortion circuit is adjusted so that at least the distortion component generated within the frequency range other than the predetermined frequency range is suppressed.

33 Claims, 15 Drawing Sheets

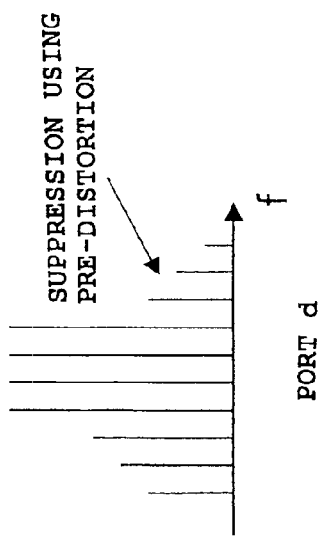
Fig. 15 (a) PORT a
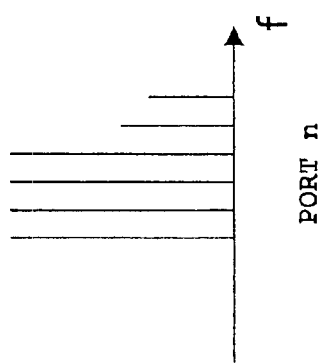
Fig. 15 (b) PORT n
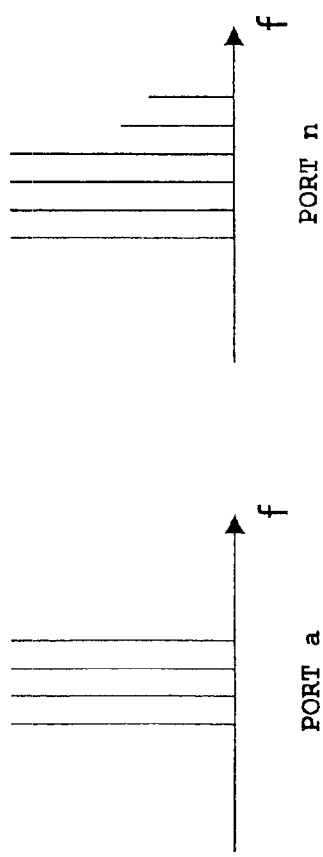
Fig. 15 (c) PORT d — SUPPRESSION USING PRE-DISTORTION
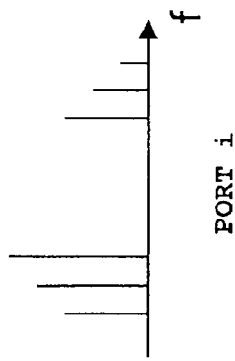
Fig. 15 (d) PORT i
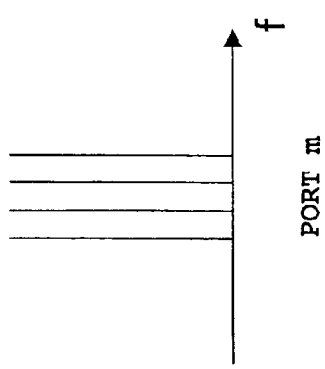
Fig. 15 (e) PORT m

FEEDFORWARD AMPLIFIER, COMMUNICATION APPARATUS, FEEDFORWARD AMPLIFICATION METHOD, PROGRAM AND MEDIUM

This application is a U.S. National Phase Application of PCT International Application PCT/JP01/10469 filed Nov. 30, 2001.

TECHNICAL FIELD

The present invention relates to a feedforward amplifier, communication apparatus, feedforward amplification method, program and medium used for a base station apparatus of mobile communication equipment, etc.

BACKGROUND ART

In recent years, high-output linear power amplifiers compensated for distortion using a feedforward have been used for base station apparatus of mobile communication equipment.

First, the configuration of a conventional feedforward amplifier will be explained with reference to FIG. 12, which is a block diagram of the conventional feedforward amplifier.

In FIG. 12, reference numeral 1 denotes an input terminal; 2, an output terminal; 3 and 9, power dividers; 4 and 10, power combiners; 5 and 12, vector adjustors; 7, a main amplifier; 8 and 11, delay circuits; 13, an auxiliary amplifier. Furthermore, reference characters a to k and m marked on power dividers 3 and 9, and power combiners 4 and 10 denote their respective ports.

An input signal including a plurality of carrier frequency components is applied from input terminal 1 and is divided into two portions by the power divider 3 at port b and port c, respectively.

The signal output from the port b is passed through the vector adjustor 5 and amplified by the main amplifier 7. The resultant signal is passed through the power divider 9 and delay circuit 11 and input to port j of the power combiner 4. At this time, due to non-linearity of the main amplifier 7, a signal including not only the carrier frequency components but also distortion components originated by intermodulation are input. Furthermore part of the output signal of the main amplifier 7 is extracted from port f of the power divider 9 and input to port h of the power combiner 10.

On the other hand, the signal output from the port c is passed through the delay circuit 8 and input to port g of the power combiner 10.

Here, by adjusting the vector adjustor 5 and delay circuit 8 so that the carrier frequency components of the signals input to the port g and port h have the same amplitude and opposite phases, a signal containing only the distortion components with the carrier frequency components canceled out is output from the port i.

Then, the signal output from the port i is passed through the vector adjustor 12, amplified by the auxiliary amplifier 13 and input to the port k of the power combiner 4.

Here, by adjusting the vector adjustor 12 and delay circuit 11 so that the distortion components of the signals input to the port j and port k have the same amplitude and opposite phases, a signal including only the carrier frequency components with the distortion components canceled out is output from the port m of the power combiner 4 to the output terminal 2.

Different from the above-described distortion compensation system, there is known a pre-distortion system (pre-distortion compensation system). The configuration of the pre-distortion circuit will be explained with reference to FIG. 13, which is a block diagram of the pre-distortion circuit.

In FIG. 13, reference numeral 61 denotes a power divider; 62, a power combine; 63, a delay circuit; 69, a vector adjustor; 72, a distortion generation circuit. The power divider 61, power combiner 62, delay circuit 63, vector adjustor 69 and distortion generation circuit 72 constitute a pre-distortion circuit 6. Furthermore, reference character n marked on the power combiner 62 denotes a port.

In operation, pre-distortion system suppresses distortion by inputting signals having the same frequency components as those of the distortion components generated at the main amplifier 7 into the main amplifier 7 with an appropriate amplitude/phase relationship.

The input signal including the plurality of carrier frequency components input from the input terminal (the terminal on the left side in FIG. 13) is divided into two portions by the power divider 61.

One portion of the two divided output signals is input to the power combiner 62 through the delay circuit 63. The other portion of output signal is input to the distortion generation circuit 72, which outputs a signal with the same frequency component as the distortion component generated at the main amplifier 7. The signal output at the distortion generation circuit 72 is input to the power combiner 62 through the vector adjustor 69 and combined with the output signal from the delay circuit 63. At this time, the vector adjustor 69 is adjusted in such a way as to have an appropriate amplitude/phase relationship with the input signal.

The signal combined at the power combiner 62 is output from the port n and input to the main amplifier 7.

However, with the feedforward amplifier in FIG. 12, as the carrier band widens, a difference is produced in the conditions under which the vector adjustor 12 suppresses the distortion component generated on the higher frequency side and the distortion component generated on the lower frequency side than the carrier band to a maximum degree. That is, if the vector adjustor 12 is adjusted in such a way as to suppress the distortion component on the high frequency side to a maximum, the distortion component on the low frequency side is not suppressed sufficiently, and vice versa. Thus, the vector adjustor 12 has been adjusted so far so that the distortion component on the high frequency side and the distortion component on the low frequency side reach the same level.

Moreover, with the pre-distortion circuit in FIG. 13, as the carrier band widens, it is also difficult to suppress the distortion component on the higher frequency side and the distortion component on the lower frequency side than the carrier band simultaneously. Thus, suppression has been performed so far in such a way that the distortion component on the high frequency side and the distortion component on the low frequency side reach the same level, but the result of this shows that it is only possible to suppress the distortion components on the order of a few dB.

A feedforward amplifier using both the pre-distortion system together with feedforward system has previously performed suppression in such a way that the distortion component on the high frequency side and the distortion component on the low frequency side reach the same level. This is the case especially when the distortion component generated at the main amplifier 7 has an unbalance between the high frequency side and low frequency side of the carrier band. Thus, distortion has not been suppressed efficiently.

DISCLOSURE OF INVENTION

The present invention has been implemented in view of the above-described conventional problems and it is an object of the present invention to provide a feedforward amplifier, communication apparatus, feedforward amplification method, program and medium capable of efficiently suppressing distortion components.

A first aspect of the present invention is a feedforward amplifier comprising:

a first power divider that divides an input signal into two portions;

a first vector adjustor that adjusts the amplitude and phase of one portion of the output signal of said first power divider;

a pre-distortion compensation circuit connected to said first vector adjustor;

a main amplifier to amplify the output signal of said pre-distortion compensation circuit;

a second power divider that divides the output signal of said main amplifier into two portions;

a first delay circuit that delays the other portion of the output signal of said first power divider;

a distortion detection power combiner that combines the one portion of the output signal of said second power divider and the output signal of said first delay circuit;

a second delay circuit that delays the other portion of the output signal of said second power divider;

a second vector adjustor that adjusts the amplitude and phase of the output signal of said distortion detection combiner;

an auxiliary amplifier that amplifies the output signal of said second vector adjustor; and a distortion elimination power combiner that combines the output signal of said second delay circuit and the output signal of said auxiliary amplifier, wherein said second vector adjustor is adjusted so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed, and said pre-distortion compensation circuit is adjusted so that suppression is performed on at least the distortion component generated within the frequency range other than said predetermined frequency range.

A second aspect of the present invention is the feedforward amplifier according to the first aspect, wherein said predetermined frequency range is the entire distortion signal band on the high frequency side or low frequency side generated at said main amplifier.

A third aspect of the present invention is the feedforward amplifier according to the first aspect of the present invention, wherein said pre-distortion compensation circuit is provided between said first power divider and said first vector adjustor.

A fourth aspect of the present invention is the feedforward amplifier according to the first aspect of the present invention, comprising:

at least one pilot signal oscillator;

a first power combiner that combines the output signal of said pilot signal oscillator and the output signal of said pre-distortion compensation circuit and outputs the combined signal to said main amplifier;

a third power divider that divides the output signal of said distortion detection power combiner into two portions and inputs the one portion of the output signal to said second vector adjustor;

a fourth power divider that divides the other portion of the output signal of said third power divider into two portions;

a band pass filter connected to one output terminal of said fourth power divider;

a distortion level detection circuit that detects the signal level of the output signal of said band pass filter;

a carrier level detection circuit that detects the signal level of the other portion of the output signal of said fourth power divider;

a fifth power divider that divides the output signal of said distortion elimination power combiner into two portions;

a pilot level detection circuit that detects the signal level of one portion of the output signal of said fifth power divider; and control means of automatically adjusting (1) said pre-distortion compensation circuit according to the signal level detected at said distortion level detection circuit, (2) said first vector adjustor according to the signal level detected at said carrier level detection circuit and (3) said second vector adjustor according to the signal level detected at said pilot level detection circuit, wherein the other portion of the output signal of said fifth power divider is supplied to the subsequent section.

A fifth aspect of the present invention is the feedforward amplifier according to the first aspect of the present invention, comprising:

a third power divider that divides the output signal of said distortion detection power combiner into two portions and inputs the one portion of the output signal to said second vector adjustor;

a fourth power divider that divides the other portion of the output signal of said third power divider into two portions;

a band pass filter connected to one output terminal of said fourth power divider;

a switch circuit that selects and switches between the output signal of said band pass filter and the other portion of the output signal of said fourth power divider according to a control signal from said control means;

a signal level detection circuit that detects the signal level of said selected signal out of the output signal of said band pass filter and the other portion of the output signal of said fourth power divider; and control means of automatically adjusting, based on the signal level detected at said signal level detection circuit, (1) said pre-distortion compensation circuit when the output signal of said bandpass filter is selected and (2) said first vector adjustor when the other portion of the output signal of said fourth power divider is selected, respectively.

A sixth aspect of the present invention is the feedforward amplifier according to the fourth aspect, wherein said control means stops the operation of said auxiliary amplifier or the function of said pre-distortion compensation circuit based on a predetermined condition.

A seventh aspect invention of the present invention is the feedforward amplifier according to the sixth aspect of the present invention, comprising input signal level detecting means of detecting the signal level of said input signal, wherein stopping the operation of said auxiliary amplifier or the function of said pre-distortion compensation circuit based on said predetermined condition means that said control means stops the operation of said auxiliary amplifier when the signal level of said detected input signal is equal to or lower than a predetermined value.

An eighth aspect of the present invention is the feedforward amplifier according to the sixth aspect of the present invention, comprising input signal level detecting means of detecting the signal level of said input signal, wherein stopping the operation of said auxiliary amplifier or the function of said pre-distortion compensation circuit based on said predetermined condition means that said control means stops the function of said pre-distortion compensation circuit when the signal level of said detected input signal is equal to or lower than a predetermined value.

A ninth aspect of the present invention is the feedforward amplifier according to the sixth aspect of the present invention, comprising input signal level detecting means of detecting the signal level of said input signal, wherein stopping the operation of said auxiliary amplifier or the function of said pre-distortion compensation circuit based on said predetermined condition means that said control means (1) stops the function of said pre-distortion compensation circuit when the signal level of said detected input signal is equal to or lower than a first predetermined value and higher than a second predetermined value which is a value lower than said first predetermined value and (2) stops the operation of said auxiliary amplifier when the signal level of said input signal is equal to or lower than said second predetermined value.

A tenth aspect of the present invention is the feedforward amplifier according to the sixth aspect of the present invention comprising:

a transmission line placed in parallel to said pre-distortion compensation circuit; and first and second switch circuits, placed on the input side of said pre-distortion compensation circuit and said transmission line and on the output side of said pre-distortion compensation circuit and said transmission line, respectively to perform switching on said pre-distortion compensation circuit side and on said transmission line side, wherein stopping the function of said pre-distortion compensation circuit means connecting said first and second switch circuits to said transmission line side.

An eleventh aspect of the present invention is the feedforward amplifier according to any of the seventh to the ninth aspects of the present invention, wherein said input signal level detecting means is provided on a signal line including the input signal component.

A twelfth aspect of the present invention is the feedforward amplifier according to any of the first to the tenth aspects of the present invention, wherein said pre-distortion compensation circuit comprising: of the present invention, wherein said pre-distortion compensation circuit comprising:

a sixth power divider that divides a signal into two potions;

a distortion generation circuit that generates distortion by inputting one portion of the output signal of said sixth power divider;

a third vector adjustor that adjusts the amplitude and phase of the output signal of said distortion generation circuit;

a third delay circuit that delays the other portion of the output signal of said sixth power divider; and a second power combiner that combines the output signal of said third vector adjustor and the output signal of said third delay circuit.

A thirteenth aspect of the present invention is the feedforward amplifier according to the twelfth aspect of the present invention, wherein said distortion generation circuit comprising:

a seventh power divider that divides a signal into two potions;

a fourth vector adjustor that adjusts the amplitude and phase of one portion of the output signal of said seventh power divider;

a distortion generation power amplifier that amplifies the output signal of said fourth vector adjustor;

a fourth delay circuit that delays the other portion of the output signal of said seventh power divider; and a third power combiner that combines the output signal of said distortion generation power amplifier and the output of said fourth delay circuit.

A fourteenth aspect of the present invention is the feedforward amplifier according to the twelfth aspect of the present invention, wherein automatically adjusting said pre-distortion compensation circuit according to the signal level detected by said distortion level detection circuit means adjusting the amplitude and phase of said third vector adjustor.

A fifteenth aspect of the present invention is the feedforward amplifier according to the twelfth aspect of the present invention, wherein stopping the function of said pre-distortion compensation circuit means that the output signal from said distortion generation circuit is not input to said second power combiner.

A sixteenth aspect of the present invention is the feedforward amplifier according to the twelfth aspect of the present invention, wherein said distortion generation circuit is constructed of only a distortion generation power amplifier for amplifying an input signal.

A seventeenth aspect of the present invention is the feedforward amplifier according to the twelfth aspect of the present invention, wherein said third delay circuit is constructed using all or part of said first delay circuit.

An eighteenth aspect of the present invention is the feedforward amplifier according to the thirteenth aspect of the present invention, wherein said fourth delay circuit is constructed using all or part of said first delay circuit.

A nineteenth aspect of the present invention is the feedforward amplifier according to the thirteenth aspect of the present invention, wherein said distortion generation power amplifier is constructed of a non-linear device.

A twentieth aspect of the present invention is the feedforward amplifier according to the first aspect of the present invention, wherein the distortion component generated within said predetermined frequency range is greater than distortion components generated in a frequency range other than said predetermined frequency range.

A twenty-first aspect of the present invention is the feedforward amplifier according to the first aspect of the present invention, wherein an adjustment is made so that the distortion component out of said distortion components to be suppressed, which is generated within the predetermined frequency range is greater than distortion components generated in a frequency range other than the predetermined frequency range.

A twenty-second aspect of the present invention is the feedforward amplifier according to the twenty-first aspect of the present invention, comprising:

a pilot signal oscillator adjustable so that an oscillation frequency falls in the vicinity of said predetermined frequency range;

a first power combiner that combines the output signal of said pilot signal oscillator and the output signal of said pre-distortion compensation circuit and outputs the combined signal to said main amplifier;

a third power divider that divides the output signal of said distortion detection power combiner into two portions and inputs one portion of the output signal to said second vector adjustor;

a fourth power divider that divides the other portion of the output signal of said third power divider into three portions;

a low frequency side distortion signal band pass filter connected to the first output terminal of said fourth power divider;

a low frequency side distortion level detection circuit that detects the signal level of the output signal of said low frequency side distortion signal band pass filter;

a high frequency side distortion signal band pass filter connected to the second output terminal of said fourth power divider;

a high frequency side distortion level detection circuit that detects the signal level of the output signal of said high frequency side distortion signal band pass filter;

a carrier level detection circuit that detects the signal level of the third output signal of said fourth power divider;

a fifth power divider that divides the output signal of said distortion elimination power combiner into two portions;

a pilot level detection circuit that detects the signal level of the other portion of the output signal of said fifth power divider; and control means of automatically adjusting (1) said pre-distortion compensation circuit and pilot signal oscillator according to the signal level detected at said low frequency side distortion level detection circuit and the signal level detected at said high frequency side distortion level detection circuit, (2) said first vector adjustor according to the signal level detected at said carrier level detection circuit and (3) said second vector adjustor according to the signal level detected at said pilot level detection circuit, respectively, wherein the other portion of the output signal of said fifth power divider is supplied to the subsequent section.

A twenty-third aspect of the present invention is the feedforward amplifier according to the twenty-second aspect of the present invention, wherein said pre-distortion compensation circuit and pilot signal oscillator are automatically adjusted (a) when the signal level detected at said low frequency side distortion level detection circuit is greater than the signal level detected at said high frequency side distortion level detection circuit, in such a way that said predetermined frequency range becomes the frequency range corresponding to said low frequency side and (b) when the signal level detected at said high frequency side distortion level detection circuit is greater than the signal level detected at said low frequency side distortion level detection circuit, in such a way that said predetermined frequency range becomes the frequency range corresponding to said high frequency side.

A twenty-fourth invention of the present invention (corresponding to claim 24) is a feedforward amplifier comprising:

a first power divider that divides an input signal into two portions;

a first vector adjustor that adjusts the amplitude and phase of one portion of the output signal of said first power divider;

a main amplifier to amplify the output signal of said first vector adjustor;

a second power divider that divides the output signal of said main amplifier into two portions;

a first delay circuit that delays the other portion of the output signal of said first power divider;

a distortion detection power combiner that combines the one portion of the output signal of said second power divider and the output signal of said first delay circuit;

a second delay circuit that delays the other portion of the output signal of said second power divider;

a second vector adjustor that adjusts the amplitude and phase of the output signal of said distortion detection combiner;

an auxiliary amplifier that amplifies the output signal of said second vector adjustor; and a distortion elimination power combiner that combines the output signal of said second delay circuit and the output signal of said auxiliary amplifier, wherein said second vector adjustor is adjusted so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

A twenty-fifth aspect of the present invention is a communication apparatus using the feedforward amplifier according to any of the first to the twenty-fourth aspect of the present invention.

A twenty-sixth aspect of the present invention is a feedforward amplification method comprising:

a step of dividing an input signal into two portions using a first power divider;

a step of adjusting the amplitude and phase of one portion of the output signal of said first power divider using a first vector adjustor;

a step of amplifying the output signal of said pre-distortion compensation circuit connected to said first vector adjustor using a main amplifier;

a step of dividing the output signal of said main amplifier into two portions using a second power divider;

a step of delaying the other portion of the output signal of said first power divider using a first delay circuit;

a step of combining the one portion of the output signal of said second power divider and the output signal of said first delay circuit using a distortion detection power combiner;

a step of delaying the other portion of the output signal of said second power divider using a second delay circuit;

a step of adjusting the amplitude and phase of the output signal of said distortion detection combiner using a second vector adjustor;

a step of amplifying the output signal of said second vector adjustor using an auxiliary amplifier;

a step of combining the output signal of said second delay circuit and the output signal of said auxiliary amplifier using a distortion elimination power combiner;

a step of adjusting said second vector adjustor so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed; and a step of adjusting said pre-distortion compensation circuit so that at least the distortion component generated in a frequency range other than said predetermined frequency range is suppressed.

A twenty-seventh aspect of the present invention is a feedforward amplification method comprising:

a step of dividing an input signal into two portions using a first power divider;

a step of adjusting the amplitude and phase of one portion of the output signal of said first power divider using a first vector adjustor;

a step of amplifying the output signal of said first vector adjustor using a main amplifier;

a step of dividing the output signal of said main amplifier into two portions using a second power divider;

a step of delaying the other portion of the output signal of said first power divider using a first delay circuit;

a step of combining the one portion of the output signal of said second power divider and the output signal of said first delay circuit using a distortion detection power combiner;

a step of delaying the other portion of the output signal of said second power divider using a second delay circuit;

a step of adjusting the amplitude and phase of the output signal of said distortion detection combiner using a second vector adjustor;

a step of amplifying the output signal of said second vector adjustor using an auxiliary amplifier;

a step of combining the output signal of said second delay circuit and the output signal of said auxiliary amplifier using a distortion elimination power combiner; and a step of adjusting said second vector adjustor so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

A twenty-eighth aspect of the present invention is a program for allowing a computer to execute all or some of the steps of the feedforward amplification method according to the twenty-sixty aspect of the present invention, comprising:

a step of dividing an input signal into two portions using a first power divider;

a step of adjusting the amplitude and phase of one portion of the output signal of said first power divider using a first vector adjustor;

a step of amplifying the output signal of said pre-distortion compensation circuit connected to said first vector adjustor using a main amplifier;

a step of dividing the output signal of said main amplifier into two portions using a second power divider;

a step of delaying the other portion of the output signal of said first power divider using a first delay circuit;

a step of combining the one portion of the output signal of said second power divider and the output signal of said first delay circuit using a distortion detection power combiner;

a step of delaying the other portion of the output signal of said second power divider using a second delay circuit;

a step of adjusting the amplitude and phase of the output signal of said distortion detection combiner using a second vector adjustor;

a step of amplifying the output signal of said second vector adjustor using an auxiliary amplifier;

a step of combining the output signal of said second delay circuit and the output signal of said auxiliary amplifier using a distortion elimination power combiner;

a step of adjusting said second vector adjustor so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed; and a step of adjusting said pre-distortion compensation circuit so that at least the distortion component generated in a frequency range other than said predetermined frequency range is suppressed.

A twenty-ninth aspect of the present invention is a computer-processable medium that stores a program for allowing a computer to execute all or some of the steps of the feedforward amplification method according to the twenty-sixth aspect of the present invention, comprising:

a step of dividing an input signal into two portions using a first power divider;

a step of adjusting the amplitude and phase of one portion of the output signal of said first power divider using a first vector adjustor;

a step of amplifying the output signal of said pre-distortion compensation circuit connected to said first vector adjustor using a main amplifier;

a step of dividing the output signal of said main amplifier into two portions using a second power divider;

a step of delaying the other portion of the output signal of said first power divider using a first delay circuit;

a step of combining the one portion of the output signal of said second power divider and the output signal of said first delay circuit using a distortion detection power combiner;

a step of delaying the other portion of the output signal of said second power divider using a second delay circuit;

a step of adjusting the amplitude and phase of the output signal of said distortion detection combiner using a second vector adjustor;

a step of amplifying the output signal of said second vector adjustor using an auxiliary amplifier;

a step of combining the output signal of said second delay circuit and the output signal of said auxiliary amplifier using a distortion elimination power combiner;

a step of adjusting said second vector adjustor so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed; and a step of adjusting said pre-distortion compensation circuit so that at least the distortion component generated in a frequency range other than said predetermined frequency range is suppressed.

A thirtieth aspect of the present invention is a program for allowing a computer to execute all or some of the steps of the feedforward amplification method according to the twenty-seventh aspect of the present invention, comprising:

a step of dividing an input signal into two portions using a first power divider;

a step of adjusting the amplitude and phase of one portion of the output signal of said first power divider using a first vector adjustor;

a step of amplifying the output signal of said first vector adjustor using a main amplifier;

a step of dividing the output signal of said main amplifier into two portions using a second power divider;

a step of delaying the other portion of the output signal of said first power divider using a first delay circuit;

a step of combining the one portion of the output signal of said second power divider and the output signal of said first delay circuit using a distortion detection power combiner;

a step of delaying the other portion of the output signal of said second power divider using a second delay circuit;

a step of adjusting the amplitude and phase of the output signal of said distortion detection combiner using a second vector adjustor;

a step of amplifying the output signal of said second vector adjustor using an auxiliary amplifier;

a step of combining the output signal of said second delay circuit and the output signal of said auxiliary amplifier using a distortion elimination power combiner; and a step of adjusting said second vector adjustor so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

A thirty-first aspect of the present invention is a computer-processable medium that stores a program for allowing a computer to execute all or some of the steps of the feedforward amplification method according to the twenty-seventh aspect of the present invention, comprising:

a step of dividing an input signal into two portions using a first power divider;

a step of adjusting the amplitude and phase of one portion of the output signal of said first power divider using a first vector adjustor;

a step of amplifying the output signal of said first vector adjustor using a main amplifier;

a step of dividing the output signal of said main amplifier into two portions using a second power divider;

a step of delaying the other portion of the output signal of said first power divider using a first delay circuit;

a step of combining the one portion of the output signal of said second power divider and the output signal of said first delay circuit using a distortion detection power combiner;

a step of delaying the other portion of the output signal of said second power divider using a second delay circuit;

a step of adjusting the amplitude and phase of the output signal of said distortion detection combiner using a second vector adjustor;

a step of amplifying the output signal of said second vector adjustor using an auxiliary amplifier;

a step of combining the output signal of said second delay circuit and the output signal of said auxiliary amplifier using a distortion elimination power combiner; and a step of adjusting said second vector adjustor so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

BRIEF DESCRIPTION OF DRAWINGS

FIG. 2(a) illustrates a frequency spectrum of a signal at port a;

FIG. 15(a) illustrates a frequency spectrum (when a predetermined frequency range corresponds to the low frequency side) of a signal at port a;

FIG. 15(b) illustrates a frequency spectrum (when a predetermined frequency range corresponds to the low frequency side) of a signal at port n;

FIG. 15(c) illustrates a frequency spectrum (when a predetermined frequency range corresponds to the low frequency side) of a signal at port d;

FIG. 15(d) illustrates a frequency spectrum (when a predetermined frequency range corresponds to the low frequency side) of a signal at port i; and FIG. 15(e) illustrates a frequency spectrum (when a predetermined frequency range corresponds to the low frequency side) of a signal at port m.

Figure 1:
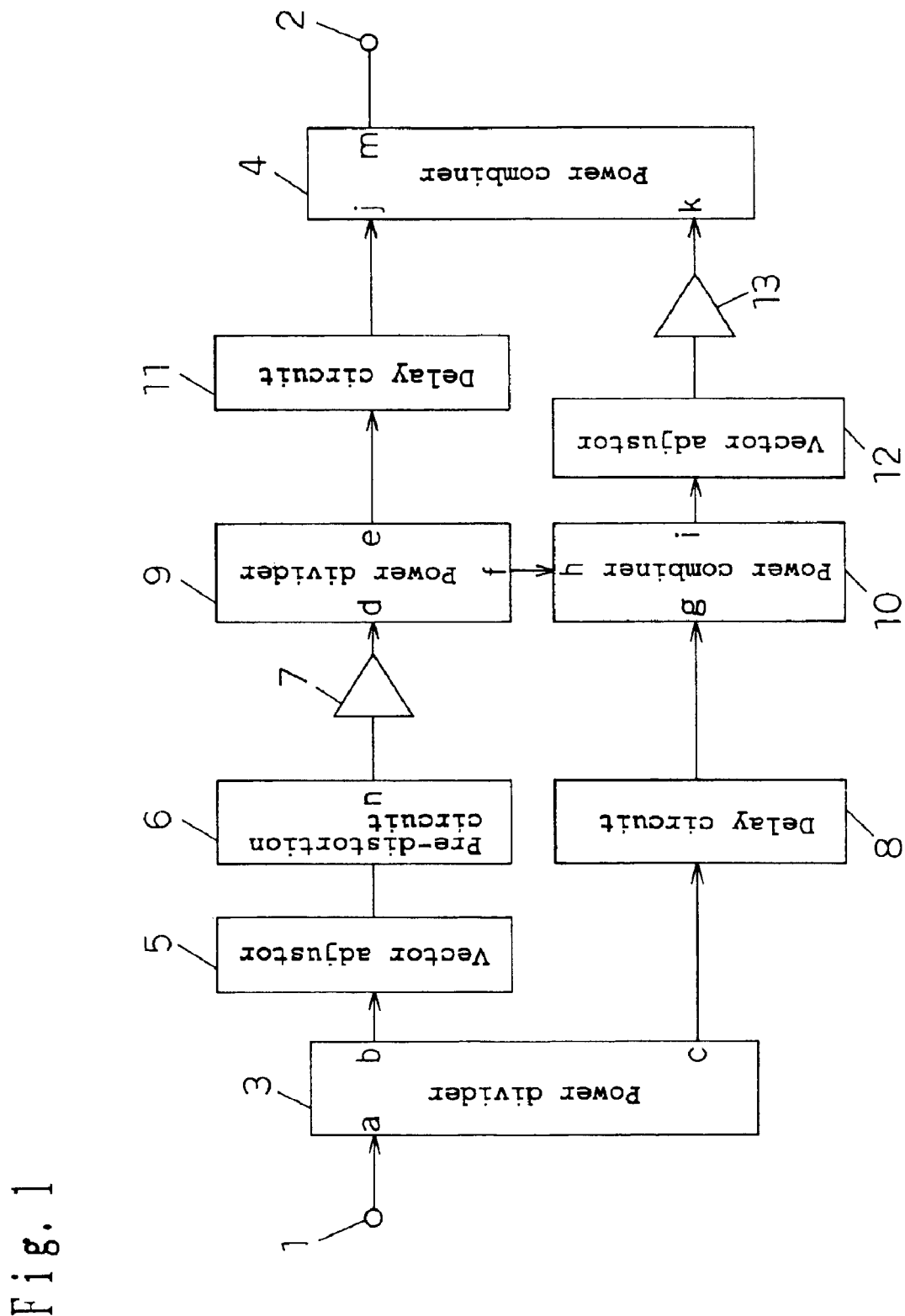
FIG. 1 is a block diagram of a feedforward amplifier according to Embodiment 1 of the present invention.

1 Input Terminal
2 Output terminal
3, 9, 31, 61, 64, 75, 83, 84, 88 Power divider
4, 10, 62, 65, 82 Power combiner
5, 12, 67, 69 Vector adjustor
6 Pre-distortion circuit
7 Main amplifier
8, 11, 63, 66, 76 Delay circuit
13 Auxiliary amplifier
32 Input signal level detection circuit
33 Input signal level detection section
34, 41, 42, 70, 91 Switch circuit
35, 71 Terminal resistor
36 Auxiliary amplifier power switch circuit
37, 90 Control circuit
43 Transmission line
68 Distortion generation power amplifier
72 Distortion generation circuit
81 Pilot signal oscillator
85 Band pass filter
86 Distortion level detection circuit
87 Carrier level detection circuit
89 Pilot level detection circuit
92 Signal level detection circuit

BEST MODE FOR CARRYING OUT THE INVENTION

With reference now to the attached drawings, embodiments of the present invention will be explained below. A feature of the present invention is that either the distortion component generated on the high frequency side or low frequency side of a carrier band is mainly subjected to distortion suppression according to a feedforward system and the resulting deterioration of the amount of distortion suppression on the opposite side is compensated according to a pre-distortion system.

Embodiment 1

First, the configuration of a feedforward amplifier of this embodiment will be explained with reference to FIG. 1, which is a block diagram of a feedforward amplifier according to Embodiment 1.

In FIG. 1, reference numeral 1 denotes an input terminal; 2, an output terminal; 3 and 9, power dividers; 4 and 10, power combiners; 5 and 12, vector adjustors; 6, a pre-distortion circuit (also called "pre-distortion compensation circuit"); 7, a main amplifier; 8 and 11, delay circuits; 13, an auxiliary amplifier. Reference characters a to k, m and n marked on the power dividers 3 and 9, power combiners 4 and 10, and the pre-distortion circuit 6 denote their respective ports. Here, the same means as those in the aforementioned conventional case are assigned the same reference numerals.

The power divider 3 corresponds to the first power divider of the present invention, the vector adjustor 5 corresponds to the first vector adjustor of the present invention, the pre-distortion circuit 6 corresponds to the pre-distortion compensation circuit of the present invention, the main amplifier 7 corresponds to the main amplifier of the present invention, the power divider 9 corresponds to the second power divider of the present invention, the delay circuit 8 corresponds to the first delay circuit of the present invention, the power combiner 10 corresponds to the distortion detection power combiner of the present invention, the delay circuit 11 corresponds to the second delay circuit of the present invention, the vector adjustor 12 corresponds to the second vector adjustor of the present invention, the auxiliary amplifier 13 corresponds to the auxiliary amplifier of the present invention, and the power combiner 4 corresponds to the distortion elimination power combiner of the present invention.

Then, the operation of the feedforward amplifier of this embodiment will be explained. While explaining the operation of the feedforward amplifier of this embodiment, an embodiment of the feedforward amplification method of this invention will also be explained (and so forth)

An input signal including a plurality of carrier frequency components input from the input terminal 1 is input to port a of the power divider 3.

The signal input to the port a of the power divider 3 is divided into two portions b and output from port b and port c, respectively.

The signal output from the port b is passed through the vector adjustor 5 and pre-distortion circuit 6, and amplified by the main amplifier 7. At this time, due to non-linearity of the main amplifier 7, a signal including not only the carrier frequency components but also distortion components originated by intermodulation are input, but as will be explained in detail later, the signal is output with part of the distortion suppressed because the pre-distortion circuit 6 is inserted.

Furthermore the output signal of the main amplifier 7 is passed through the power divider 9 and delay circuit 11 and input to port j of the power combiner 4. Part of the output signal of the main amplifier 7 is extracted from port f of the power divider 9 and input to port h of the power combiner 10.

On the other hand, the signal output from the port c is passed through the delay circuit 8 and input to port g of the power combiner 10. Here, by adjusting the vector adjustor 5 and delay circuit 8 so that the carrier frequency components of the signals input to the port g and port h have the same amplitude and opposite phases, a signal including only the distortion components with the carrier frequency components canceled out is output from the port i. Then, the signal output from the port i is passed through the vector adjustor 12, amplified by the auxiliary amplifier 13 and input to the port k of the power combiner 4.

Here, by adjusting the vector adjustor 12 and delay circuit 11 so that the distortion components of the signals input to the port j and port k have the same amplitude and opposite phases, a signal including only the carrier frequency components with the distortion components canceled out is output from the port m of the power combiner 4 to the output terminal 2.

Figure 2A:
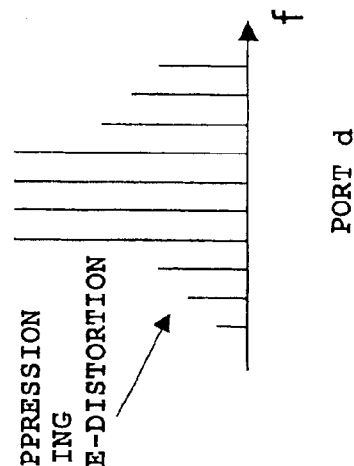
Figure 2B:
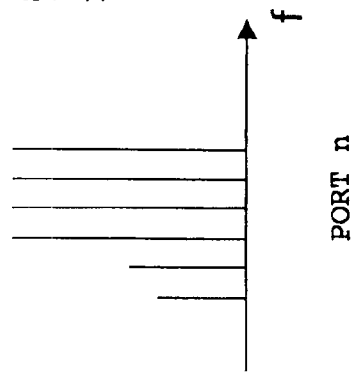
FIG. 2(b) illustrates a frequency spectrum of a signal at port n.
Figure 2C:
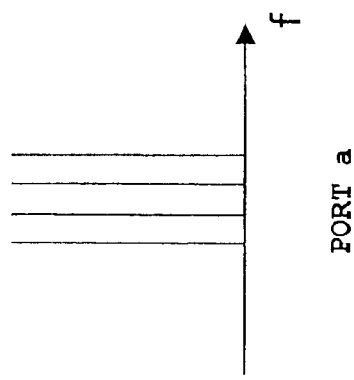
FIG. 2(c) illustrates a frequency spectrum of a signal at port d.
Figure 2D:
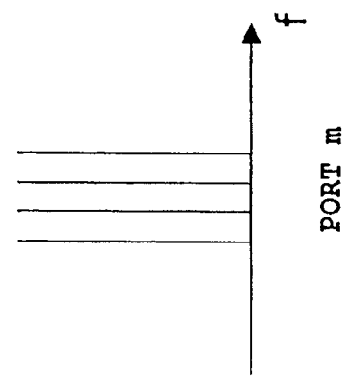
FIG. 2(d) illustrates a frequency spectrum of a signal at port i.
Figure 2E:
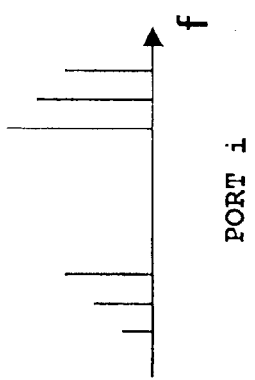
FIG. 2(e) illustrates a frequency spectrum of a signal at port m.

Then, the feature of the present invention that either the distortion component generated on the high frequency side or low frequency side of the carrier band is mainly subjected to distortion suppression according to a feedforward system and the resulting deterioration of the amount of distortion suppression on the opposite side is compensated according to a pre-distortion system will be explained with reference to FIGS. 2(a) to 2(e) in detail. FIG. 2(a) illustrates a frequency spectrum of a signal at port a, FIG. 2(b) illustrates a frequency spectrum of a signal at port n, FIG. 2(c) illustrates a frequency spectrum of a signal at port d, FIG. 2(d) illustrates a frequency spectrum of a signal at port i and FIG. 2(e) illustrates a frequency spectrum of a signal at port m. Here, FIG. 2(a) to FIG. 2(e) illustrate carrier levels on a unit basis.

For example, suppose the level of distortion generated on the higher frequency side than the carrier band is higher than the level of distortion generated on the lower frequency side in the main amplifier 7. If the vector adjustor 12 is adjusted so that the distortion component on the high frequency side with the high distortion level is mainly suppressed according to a feedforward system, the amount of distortion suppression on the low frequency side deteriorates. Thus, this deterioration will be compensated by suppressing part of the distortion component on the low frequency side through the pre-distortion circuit 6.

More specifically, for the signal input from the port a (see FIG. 2(a)), the pre-distortion circuit 6 generates input distortion to suppress part of the distortion component on the low frequency side and obtains a signal output from the port n (see FIG. 2(b)). This distortion suppression suppresses the level of distortion generated on the lower frequency side than the carrier band of the signal amplified by the main amplifier 7 and input to the port d (see FIG. 2(c)), and also suppresses the level of the lower frequency side than the carrier band of the signal output from the port i (see FIG. 2(d)) as the signal of only the distortion component. Therefore, by adjusting the vector adjustor 12 so that the level of distortion generated on the higher frequency side than the carrier band is mainly suppressed, the levels of distortion generated on both the lower frequency side and higher frequency side than the carrier band of the signal are suppressed, causing the signal output from the port m (see FIG. 2(e)) to consist substantially of only carrier frequency components.

Thus, by adopting the configuration in FIG. 1 in which either the distortion component generated on the higher frequency side or lower frequency side than a carrier band is mainly subjected to distortion suppression according to a feedforward system and the resulting deterioration of the amount of distortion suppression on the opposite side is compensated according to a pre-distortion system, it is possible to narrow the distortion compensation range according to the pre-distortion system, suppress the distortion component efficiently and improve the amount of distortion suppression as a consequence.

Embodiment 2

Then, the configuration of the feedforward amplifier of this embodiment will be explained with reference to FIG. 3, which is a block diagram of the feedforward amplifier according to Embodiment 2.

Figure 3:
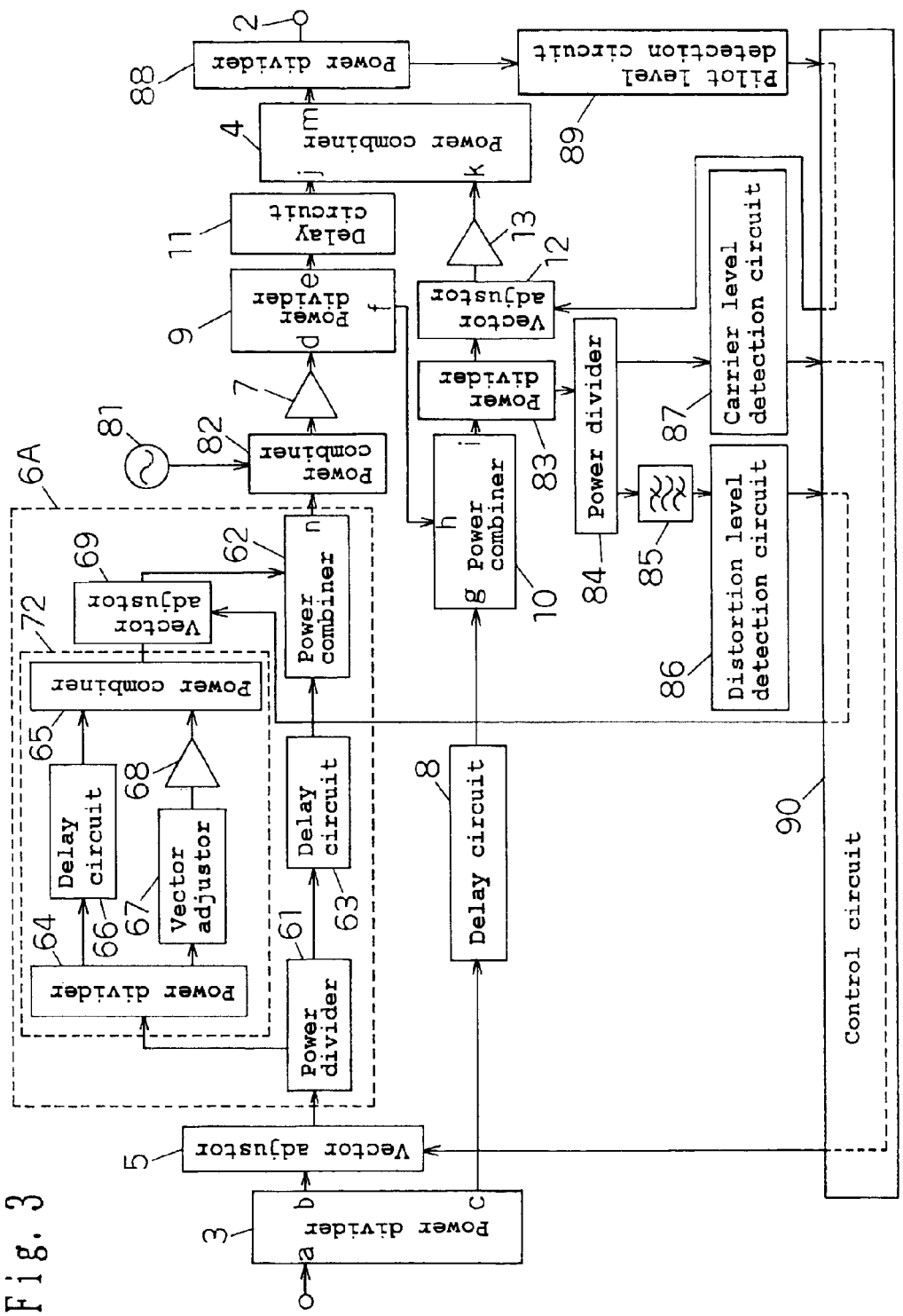
FIG. 3 is a block diagram of a feedforward amplifier according to Embodiment 2 of the present invention.

In FIG. 3, reference numerals 61, 64, 83, 84 and 88 denote power dividers; 62, 65 and 82, power combiners; 63 and 66, delay circuits; 67 and 69, vector adjustors; 68, a distortion generation power amplifier; 81, a pilot signal oscillator; 85, a band pass filter; 86, a distortion level detection circuit; 87, a carrier level detection circuit; 89, a pilot level detection circuit; 90, a control circuit. The power divider 64, power combiner 65, delay circuit 66, vector adjustor 67 and distortion generation power amplifier 68 constitute a distortion generation circuit 72. The power divider 61, power combiner 62, delay circuit 63, vector adjustor 69 and distortion generation circuit 72 constitute a pre-distortion circuit 6A.

The pilot signal oscillator 81 corresponds to the pilot signal oscillator of the present invention, the power combiner 82 corresponds to the first power combiner of the present invention, the power divider 83 corresponds to the third power combiner, the power divider 84 corresponds to the fourth power divider of the present invention, the band pass filter 85 corresponds to the band pass filter of the present invention, the distortion level detection circuit 86 corresponds to the distortion level detection circuit of the present invention, the carrier level detection circuit 87 corresponds to the carrier level detection circuit of the present invention, the power divider 88 corresponds to the fifth power divider, the pilot level detection circuit 89 corresponds to the pilot level detection circuit of the present invention and the control circuit 90 corresponds to the control means of the present invention.

The feedforward amplifier of this embodiment is a feedforward amplifier that makes automatic adjustments in such a way as to always maintain an optimal suppression condition even if the characteristics of the main amplifier 7 and auxiliary amplifier 13 change due to secular changes or environmental changes.

Then, the operation of the feedforward amplifier of this embodiment will be explained.

Since the principles of operation of the feedforward amplifier of this embodiment is the same as the principles of operation of the aforementioned feedforward amplifier of Embodiment 1, detailed explanations here will be omitted and the pre-distortion circuit 6A, which is important for the feedforward amplifier of this embodiment, will be explained.

The input signal including a plurality of carrier frequency components output from the vector adjustor 5 is divided into two portions by the power divider 61.

One of the two divided output signals is input to the power combiner 62 through the delay circuit 63.

The other output signal is further divided into two portions by the power divider 64, one of the two divided output signals is passed through the vector adjustor 67, amplified by the distortion generation power amplifier 68 and input to the power combiner 65. The other of the output signal divided by the two by the power divider 64 is passed through the delay circuit 66, input to the power combiner 65 and combined with the output signal from the distortion generation power amplifier 68. Here, by adjusting the vector adjustor 67 and delay circuit 66 so that the carrier frequency components of both signals have the same amplitude and opposite phases, the power combiner 65 outputs a signal including at least a distortion component of the frequency band to be subjected to distortion compensation by the pre-distortion circuit 6A with the carrier frequency components canceled out.

The signal output from the power combiner 65 is passed through the vector adjustor 69 and input to the power combiner 62 and combined with the output signal from the delay circuit 63. At this time, the vector adjustor 69 is adjusted so that the distortion component of the main amplifier 7 generated in the frequency band to be subjected to distortion compensation is suppressed to a maximum degree.

Then, the automatic adjustment method of the feedforward amplifier, the feature of this embodiment, will be explained.

The power divider 83 extracts part of the signal output from the port i of the power combiner 10. The extracted signal is divided into two portions by the power divider 84.

One portion of the signal divided by two is passed through the band pass filter 85, which lets the signal at the frequency band to be subjected to distortion compensation by the pre-distortion circuit 6A pass, and is input to the distortion level detection circuit 86. Here, by the control circuit 90 automatically adjusting the vector adjustor 69 so that the level of the detected distortion signal becomes a minimum, it is possible to always maintain distortion compensation according to the pre-distortion system in an optimal suppression condition.

The other portion of the signal divided by two by the power divider 84 is input to the carrier level detection circuit 87. Here, the control circuit 90 automatically adjusts the vector adjustor 5 so that the level of the detected carrier signal becomes a minimum.

On the other hand, the pilot signal oscillated from the pilot signal oscillator 81 is passed through the power combiner 82 and input to the main amplifier 7.

When, for example, the distortion component generated on the higher frequency side than the carrier band is mainly suppressed according to the feedforward system, the pilot signal is a signal with a higher frequency component than the carrier frequency which does not overlap with the distortion component. According to the feedforward system, whether distortion is suppressed or not is determined by whether the input pilot signal is suppressed or not.

The power divider 88 extracts part of the signal output from the port m of the power combiner 4 and inputs it to the pilot level detection circuit 89. Here, by the control circuit 90 automatically adjusting the vector adjustor 12 so that the level of the detected pilot signal becomes a minimum, it is possible to always maintain distortion compensation according to the feedforward system in an optimal suppression condition.

Embodiment 2 above has explained the circuit configuration using the distortion generation power amplifier 68 as the distortion generation circuit 72, but the present invention is not limited to this and it is also possible to use a device generating distortion such as a diode. Furthermore, the circuit configuration is not limited to this, but it is also possible to construct the circuit with only the distortion generation power amplifier 68.

Furthermore, Embodiment 2 above has explained a configuration example where a pilot signal having one frequency is input, but it is also possible to input pilot signals with a plurality of different frequencies.

Figure 4:
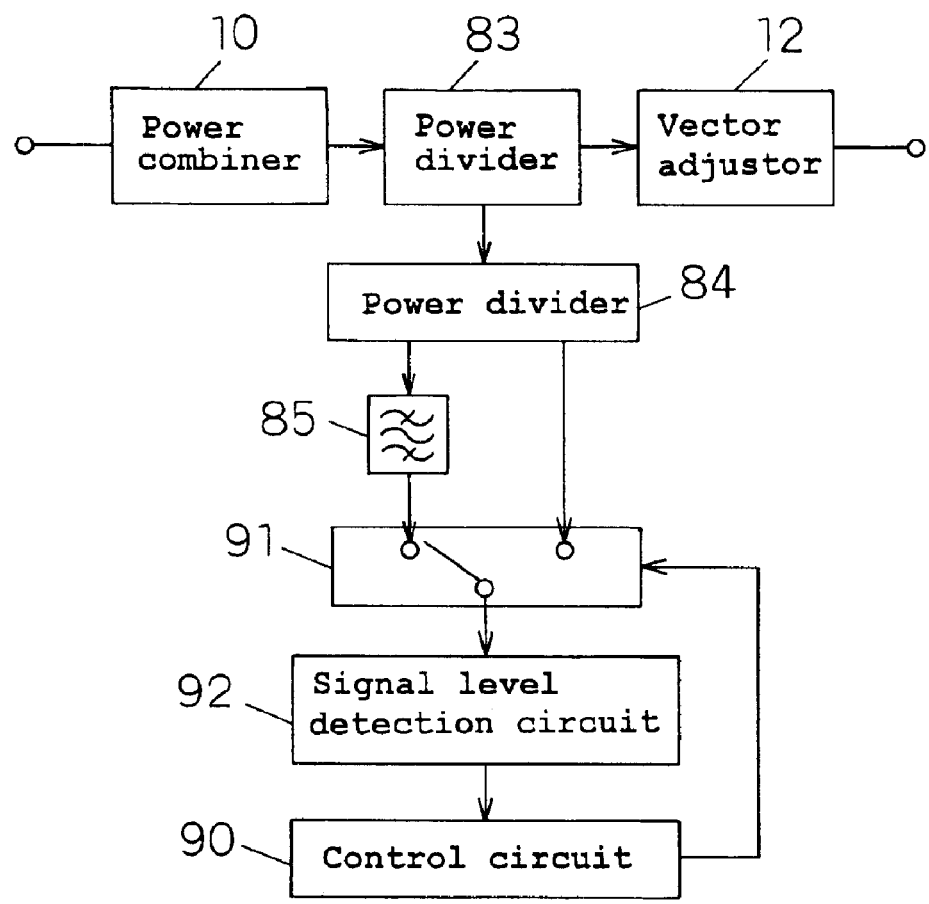
FIG. 4 illustrates a circuit configuration according to Embodiment 2 of the present invention whereby a common signal level detection circuit is switched using a switch circuit.

Furthermore, Embodiment 2 above has explained a configuration example where the pre-distortion circuit 6A is provided between the vector adjustor 5 and power combiner 82, but it is obvious that the pre-distortion circuit 6A will operate in the same way even if it is provided between the power divider 3 and vector adjustor 5:

Furthermore, when the vector adjustors 5 and 69 are not adjusted simultaneously, it is obvious, as shown in FIG. 4 illustrating a circuit configuration in which a common signal level detection circuit is switched by a switch circuit, the common signal level detection circuit 92 will function in the same way even if a common signal level detection circuit 92 is switched by a switch circuit 91. In this case, the switch circuit 91 can be switched by the control circuit 90.

Embodiment 3

Then, the configuration of the feedforward amplifier according to Embodiment 3 will be explained with reference to FIG. 5, which is a block diagram of the feedforward amplifier of this embodiment.

Figure 5:
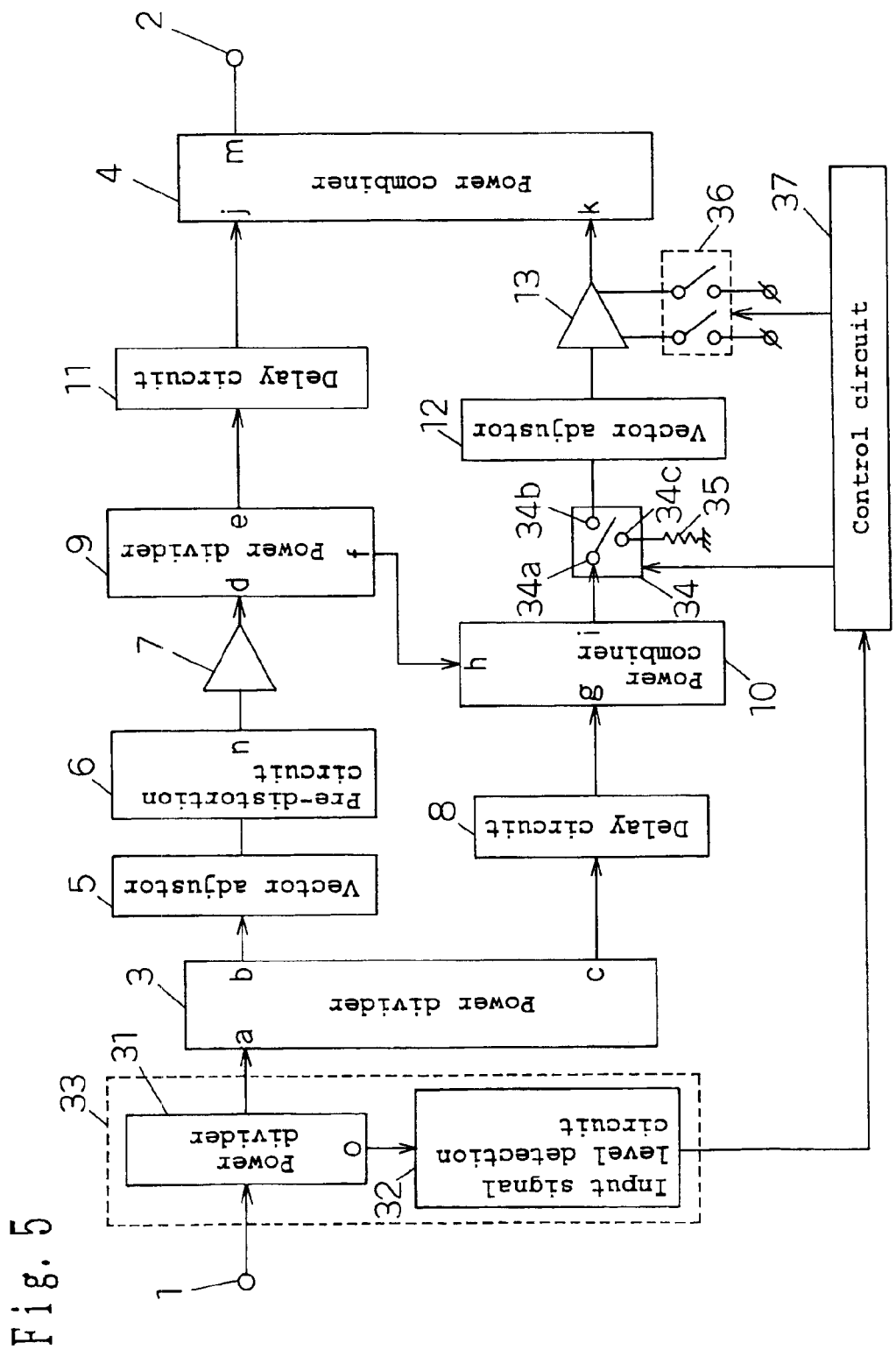
FIG. 5 is a block diagram of a feedforward amplifier according to Embodiment 3 of the present invention.

In FIG. 5, reference numeral 31 denotes a power divider; 32, an input signal level detection circuit; 34, a switch circuit; 35, a terminal resistor; 36, an auxiliary amplifier power switch circuit; 37, a control circuit that controls changeover of the switch circuit 34 and auxiliary amplifier power switch circuit 36 according to the level of an input signal detected at the input signal level detection circuit 32. The power divider 31 and input signal level detection circuit 32 constitute an input signal level detection circuit 33.

The input signal level detection circuit 32 corresponds to the input signal level detection means of the present invention.

When the output power falls considerably below a rated output, the feedforward amplifier according to this embodiment improves the efficiency during low output by suppressing distortion only according to a pre-distortion system. The output power can be easily known by converting the detected input signal level.

Figure 6:
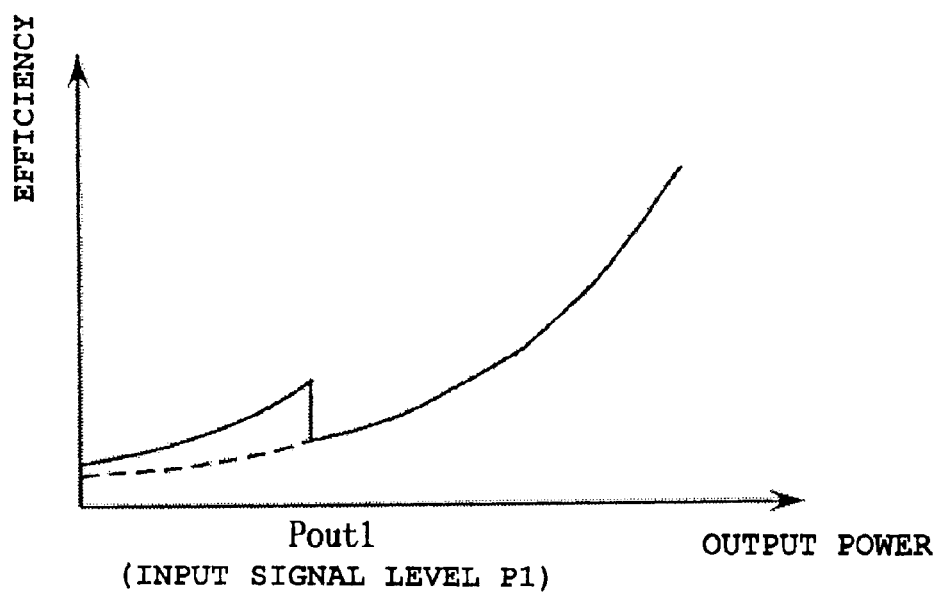
FIG. 6 is an efficiency characteristic diagram with respect to output power of the feedforward amplifier according to Embodiment 3 of the present invention.

Then, mainly with reference to FIG. 6, which is an efficiency characteristic diagram with respect to the output power of the feedforward amplifier, the operation of the feedforward amplifier of this embodiment will be explained.

When the input signal level input from the input terminal 1 detected at the input signal level detection circuit 32 is equal to or higher than P1 (dBm), the control circuit 37 connects a common terminal 34a and an output switching terminal 34b of the switch circuit 34, and further turns on the auxiliary amplifier power switch circuit 36. In this case, distortion suppression is performed using the pre-distortion system and feed forward system together. The input signal level P1 (dBm) corresponds to output power Pout1 (dBm) according to the aforementioned conversion.

When the level of the input signal is below P1 (dBm) the control circuit 37 connects the common terminal 34a and output switching terminal 34c of the switch circuit 34, and further turns off the auxiliary amplifier power switch circuit 36. This is because in this case, the level of distortion generated at the main amplifier 7 decreases and high-degree intermodulation distortion will no longer occur, and therefore distortion can be suppressed according to only the pre-distortion system. Furthermore, since the auxiliary amplifier power switch circuit 36 is turned off, the power consumed by the auxiliary amplifier 13 becomes 0, it is possible to improve the efficiency during low output as shown in FIG. 6.

Embodiment 3 above has explained the pre-distortion circuit 6 using a configuration example where it is provided between the vector adjustor 5 and main amplifier 7, but it is obvious that it will operate in the same way even if it is provided between the power divider 3 and vector adjustor 5.

Furthermore, Embodiment 3 above has explained the case where the switch circuit 34 and auxiliary amplifier power switch circuit 36 are switched according to the level of the input signal immediately after the input terminal 1, but the present invention is not limited to this and it is obvious that the system will operate in the same way even if the switch circuit 34 and auxiliary amplifier power switch circuit 36 are switched according to the level of a signal including the frequency component of an input signal. In such a case, the input signal level detection section 33 can be inserted at a point at which the signal level is detected.

Embodiment 4

Figure 7:
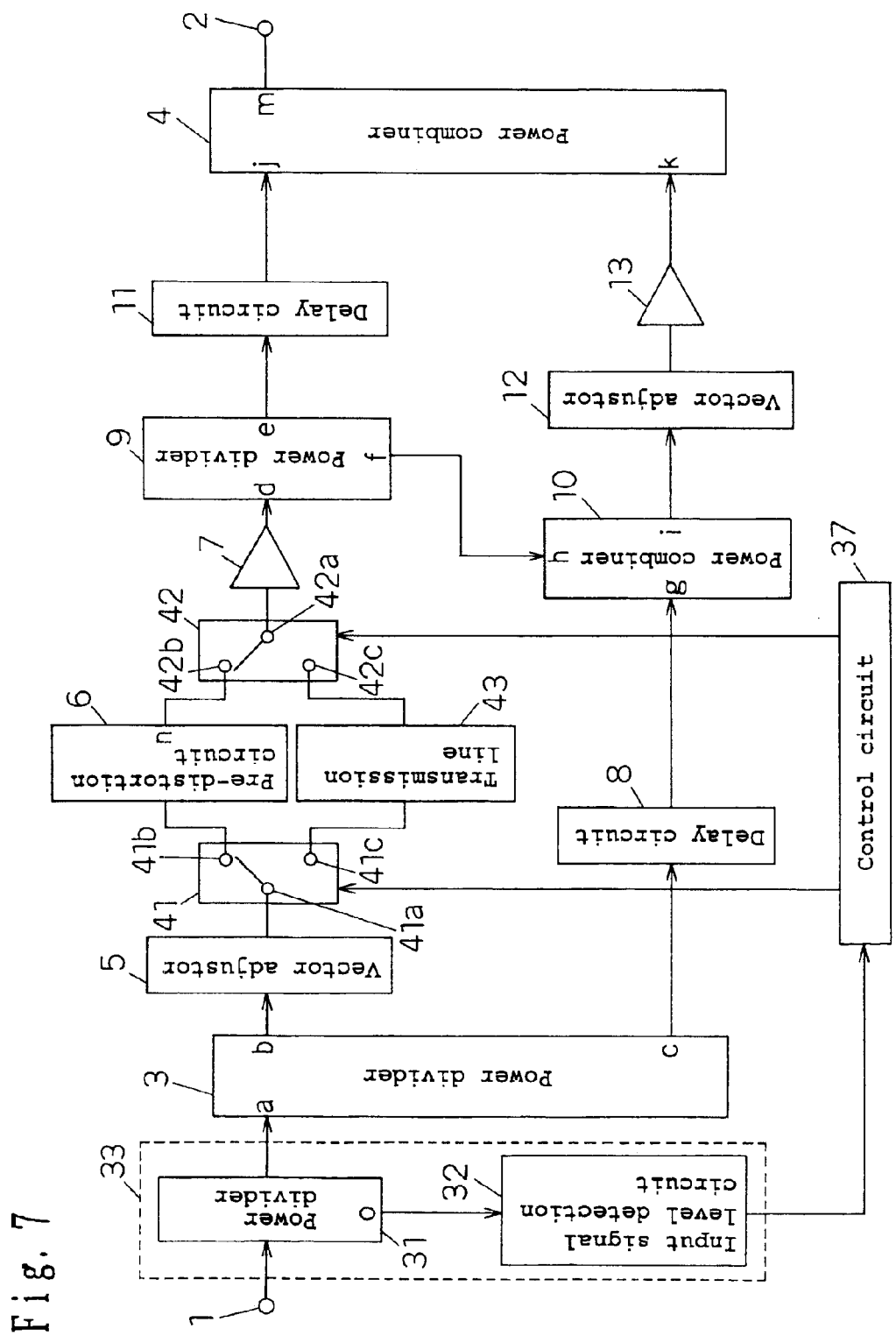
FIG. 7 is a block diagram of a feedforward amplifier according to Embodiment 4 of the present invention.

Then, the configuration of the feedforward amplifier according to Embodiment 4 will be explained with reference to FIG. 7, which is a block diagram of the feedforward amplifier of this embodiment.

The feedforward amplifier of this embodiment has a similar configuration to that of the feedforward amplifier in the aforementioned embodiment. In FIG. 7, reference numerals 41 and 42 denote switch circuits and 43 denotes a transmission line.

The transmission line 43 corresponds to the transmission line of the present invention, the switch circuit 41 corresponds to the first switch circuit of the present invention and the switch circuit 42 corresponds to the second switch circuit of the present invention.

The feedforward amplifier of this embodiment 4 is a feedforward amplifier provided with selecting means of selecting whether distortion suppression is performed using a pre-distortion system together with a feedforward system according to the output power or using only a feedforward system.

Then, the operation of the feedforward amplifier according to this embodiment will be explained.

When the level of an input signal input from the input terminal 1 detected at the input signal level detection circuit 32 is P2 (dBm) or higher, the control circuit 37 connects a common terminal 41*a* and an output changeover terminal 41*b* of the switch circuit 41, and connects a common terminal 42*a* and an output changeover terminal 42*b* of the switch circuit 42. In this case, distortion is suppressed using a pre-distortion system together with a feedforward system.

When the level of an input signal is lower than P2 (dBm), the control circuit 37 connects the common terminal 41*a* and an output changeover terminal 41*c* of the switch circuit 41, and connects the common terminal 42*a* and an output changeover terminal 42*c* of the switch circuit 42. This is because the level of distortion generated at the main amplifier 7 decreases and distortion can be suppressed enough only according to the feedforward system in this case.

By the way, a circuit configuration shown in FIG. 8, which illustrates a circuit configuration substituting a delay circuit of a pre-distortion circuit for a transmission line, can also be considered and this circuit configuration will be explained below.

Figure 8:
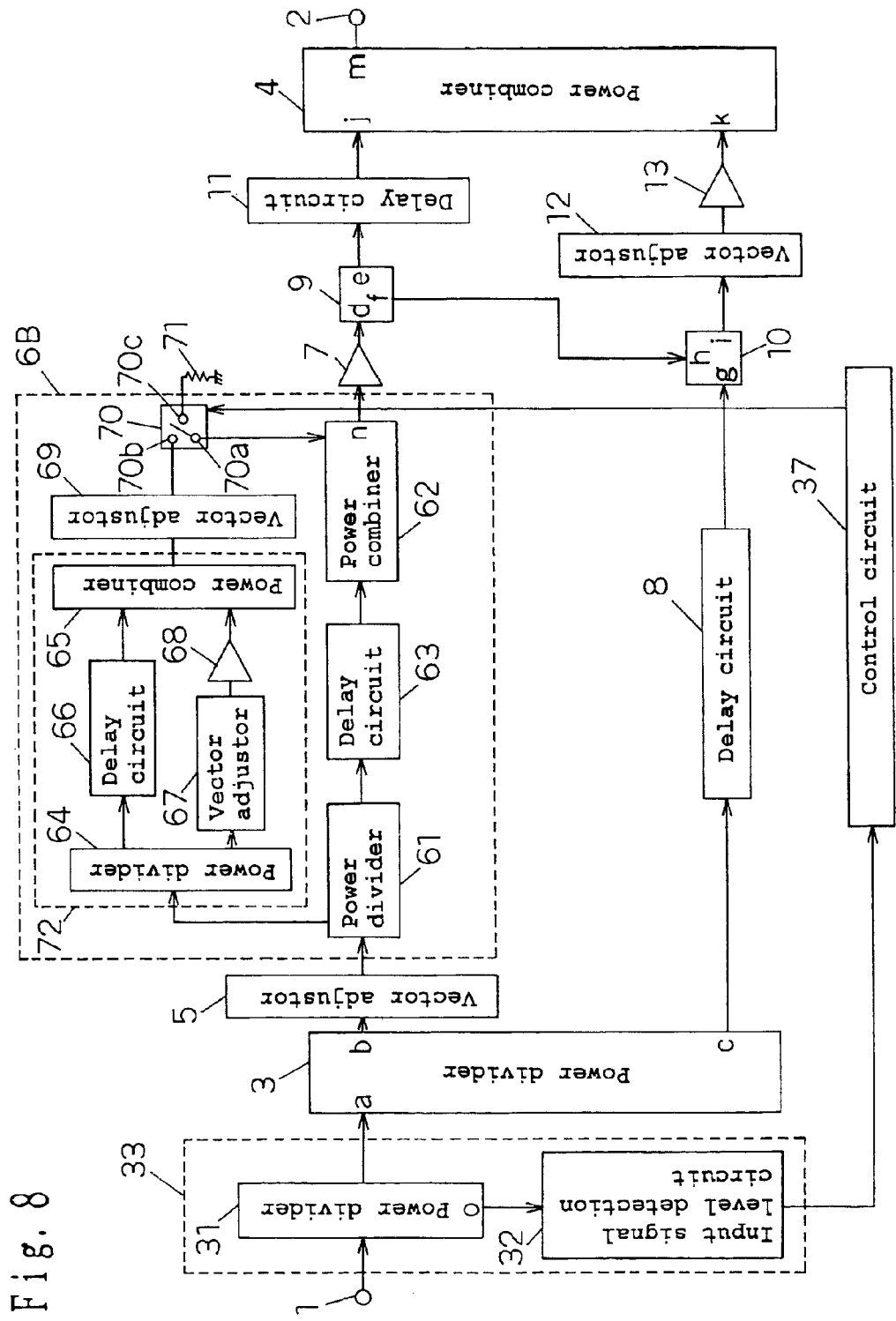
FIG. 8 illustrates a circuit configuration of a delay circuit of a pre-distortion circuit substituting for a transmission line according to Embodiment 4 of the present invention.

In FIG. 8, reference numeral 70 denotes a switch circuit and 71 denotes a terminal resistor. The transmission line 43 in FIG. 7 is substituted by a delay circuit 63 making up a pre-distortion circuit 6B in FIG. 8.

When the level of an input signal input from the input terminal 1 detected at the input signal level detection circuit 32 is P2 (dBm) or higher, the control circuit 37 connects a common terminal 70*a* and an output changeover terminal 70*b* of a switch circuit 70. In this case, distortion is suppressed using a pre-distortion system together with a feedforward system. When the level of an input signal is lower than P2 (dBm), the control circuit 37 connects the common terminal 70*a* and an output changeover terminal 70*c* of the switch circuit 70. In this case, the signal from a distortion generation circuit 72 is input to neither the power combiner 62 nor the main amplifier 7, and therefore distortion is suppressed only according to a feedforward system as a consequence.

Furthermore, in Embodiment 4 above, the switch circuit 70 is used to prevent the signal from the distortion generation circuit 72 from entering the main amplifier 7, but it is obvious that the system operates in the same way by adjusting the vector adjustor 69 instead of using the switch circuit 70 so that the signal from the distortion generation circuit 72 is attenuated to a maximum degree.

Furthermore, in Embodiment 4 above, the switch circuit 34 and auxiliary amplifier power switch circuit 36 are switched according to the input signal level immediately after the input terminal 1, but the present invention is not limited to this and it is obvious that the system operates in the same way even if the switch circuit 34 and auxiliary amplifier power switch circuit 36 are switched according to the level of the signal including the frequency component of the input signal. In that case, the input signal level detection circuit 33 can be inserted at a point at which the signal level is detected.

Figure 9:
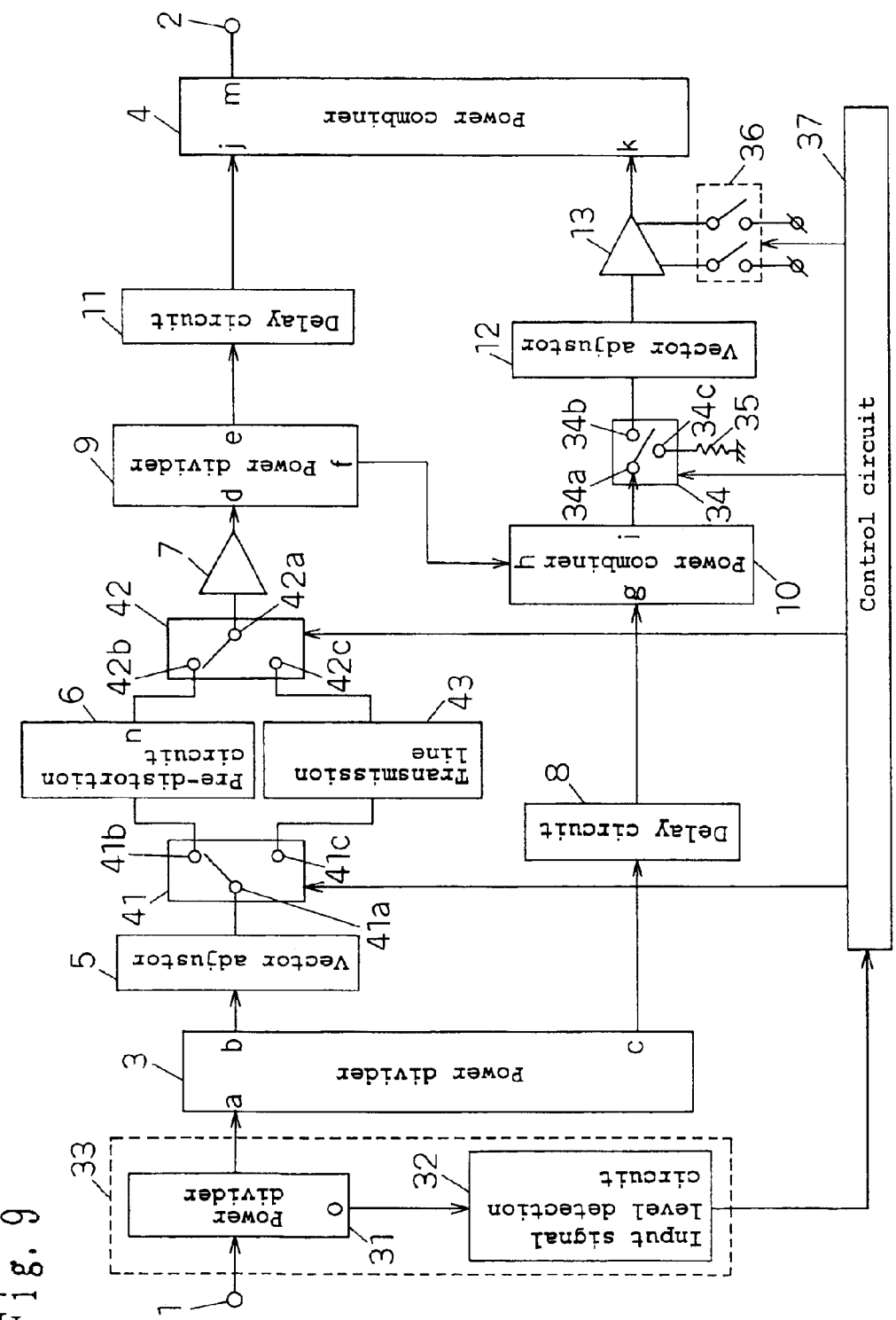
FIG. 9 illustrates a circuit configuration including both a switch circuit for selecting whether or not to use the pre-distortion system and a switch circuit for selecting whether or not to use the feedforward system according to Embodiment 4 of the present invention.

Furthermore, it is also possible to consider a circuit configuration shown in FIG. 9, which illustrates a circuit configuration including both a switch circuit to select whether or not to use a pre-distortion system and a switch circuit to select whether or not to use a feedforward system. That is, it is obvious as shown in FIG. 9 that by combining Embodiment 4 above with the functions of Embodiment 3, it is possible to perform distortion suppression by selecting whether to use both the pre-distortion system and feedforward system, or only the feedforward system or only pre-distortion system. More specifically, it is also possible (1) to stop the function of the pre-distortion compensation circuit when the level of the detected input signal is equal to or lower than a first predetermined value and higher than a second predetermined value which is smaller than the first predetermined value and (2) to stop the operation of the auxiliary amplifier when the level of the input signal is equal to or lower than the second predetermined value.

(Embodiment 5)

Figure 10:
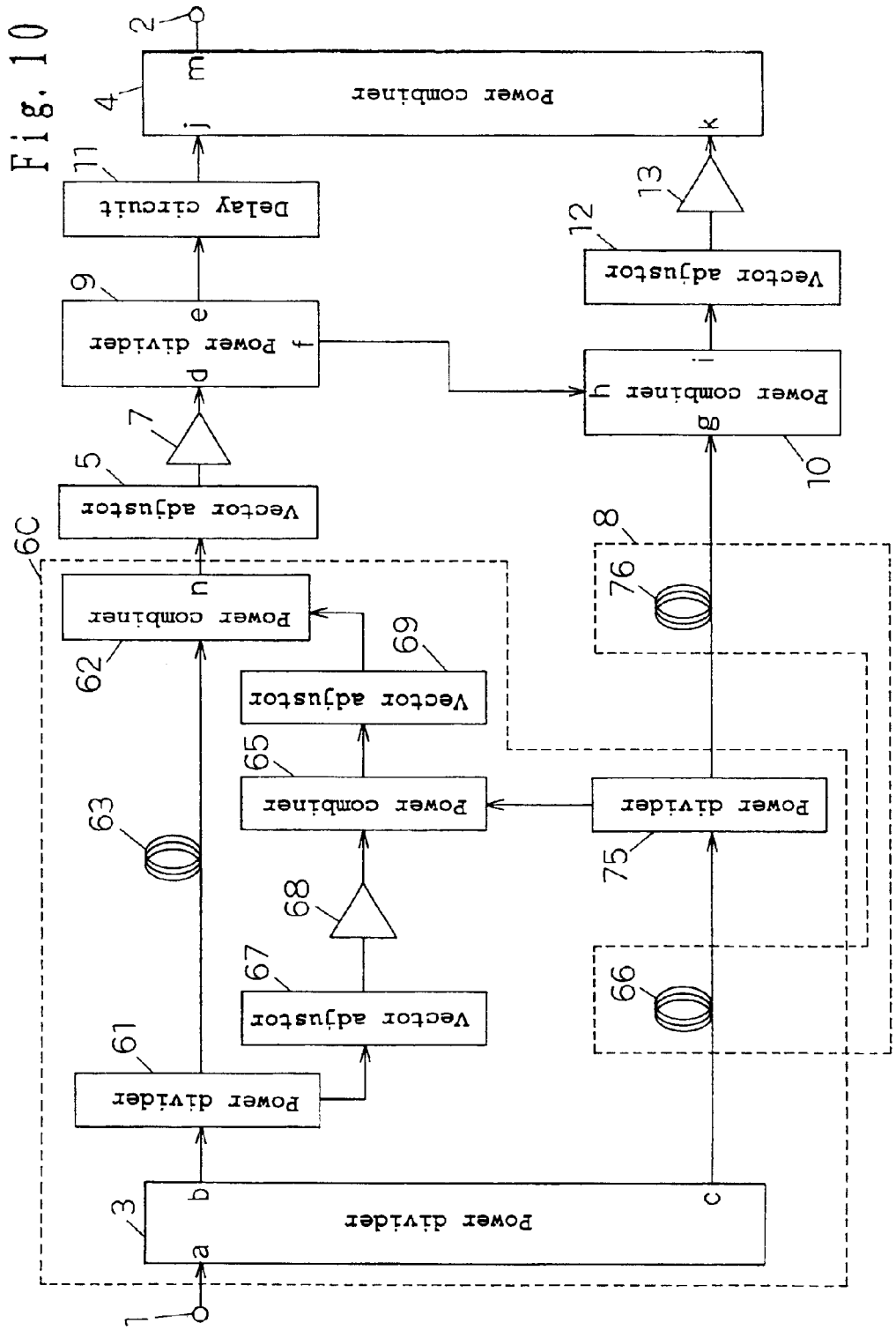
FIG. 10 is a block diagram of a feedforward amplifier according to Embodiment 5 of the present invention.

FIG. 10 is a block diagram of a feedforward amplifier according to Embodiment 5 of the present invention. In FIG. 10, reference numerals 63, 66 and 76 denote delay lines as delay circuits and 75 denotes a power divider. Power dividers 3, 61 and 75, power combiners 62 and 65, delay lines 63 and 66, vector adjustors 67 and 69, and distortion generation power amplifiers 68 constitute a pre-distortion circuit 6C. Furthermore, the delay lines 66 and 76 constitute a delay line 8 as a delay circuit.

The power divider 61 corresponds to a sixth power divider of the present invention, the distortion generation power amplifiers 68 corresponds to a distortion generation circuit of the present invention, the vector adjustor 67 corresponds to a third vector adjustor of the present invention, the delay circuit 63 corresponds to a third delay circuit of the present invention and the power combiner 62 corresponds to the second power combiner of the present invention.

The pre-distortion circuit of Embodiment 5 of the present invention is a feedforward amplifier that uses all or part of the delay line 8 making up the feedforward circuit for the delay line making up the pre-distortion circuit 6C.

Then, the operation of the feedforward amplifier of this embodiment will be explained. Here, the explanation of the principles of operation of the entire feedforward amplifier is omitted and only the principles of operation of the pre-distortion circuit 6C will be explained.

An input signal including a plurality of carrier frequency components input from an input terminal 1 is input to port a of a power divider 3. The signal input to the port a of the power divider 3 is divided into two portions and output from port b and port c, respectively.

The signal output from the port b is divided into two portions at the power divider 61. One portion of the output signal divided by two is passed through the delay line 63 and input to the power combiner 62. The other portion of the output signal divided by two is passed through the vector adjustor 67, amplified at the distortion generation power amplifier 68 and input to the power combiner 65.

Furthermore, the signal output from the port c is passed through the delay line 66 and power divider 75, input to the power combiner 65 and combined with the output signal from the aforementioned distortion generation power amplifier 68. Here, by adjusting the vector adjustor 67 and delay line 66 so that the carrier frequency components of both signals have the same amplitude and opposite phases, the power combiner 65 outputs a signal including at least the distortion components of the frequency band to be subjected to distortion compensation by the pre-distortion circuit 6C with the carrier frequency components canceled out.

The signal output from the power combiner 65 is passed through the vector adjustor 69 and input to the power combiner 62 and combined with the output signal from the aforementioned delay line 63. The vector adjustor 69 is adjusted so that the distortion component of the main amplifier 7 generated in the frequency band to be subjected to distortion compensation is suppressed to a maximum degree.

The signal combined at the power combiner 62 is output from port n.

Figure 11:
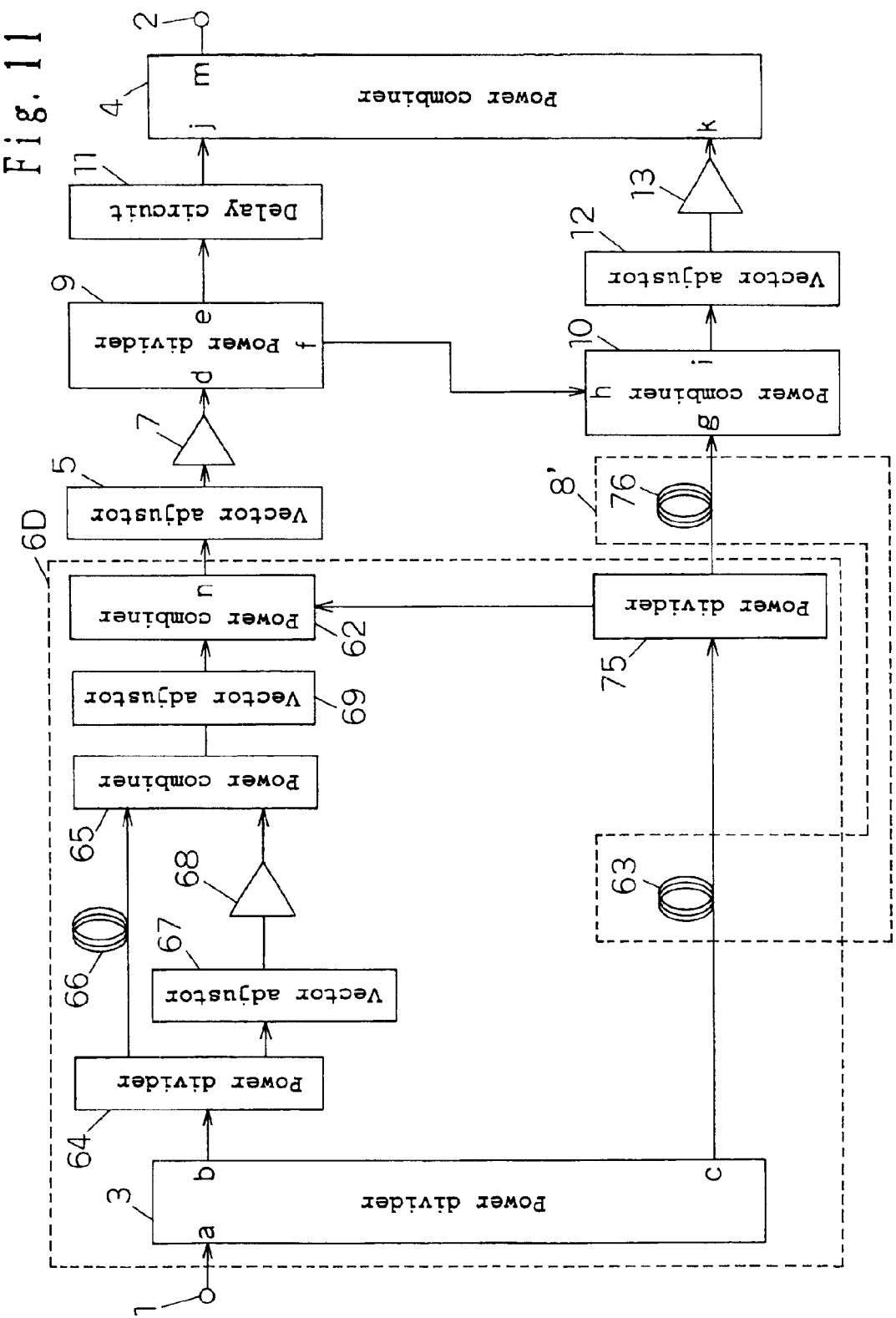
FIG. 11 illustrates another circuit configuration using all or part of the delay line making up the feedforward circuit for the delay line making up the pre-distortion circuit according to Embodiment 5 of the present invention.
Figure 12:
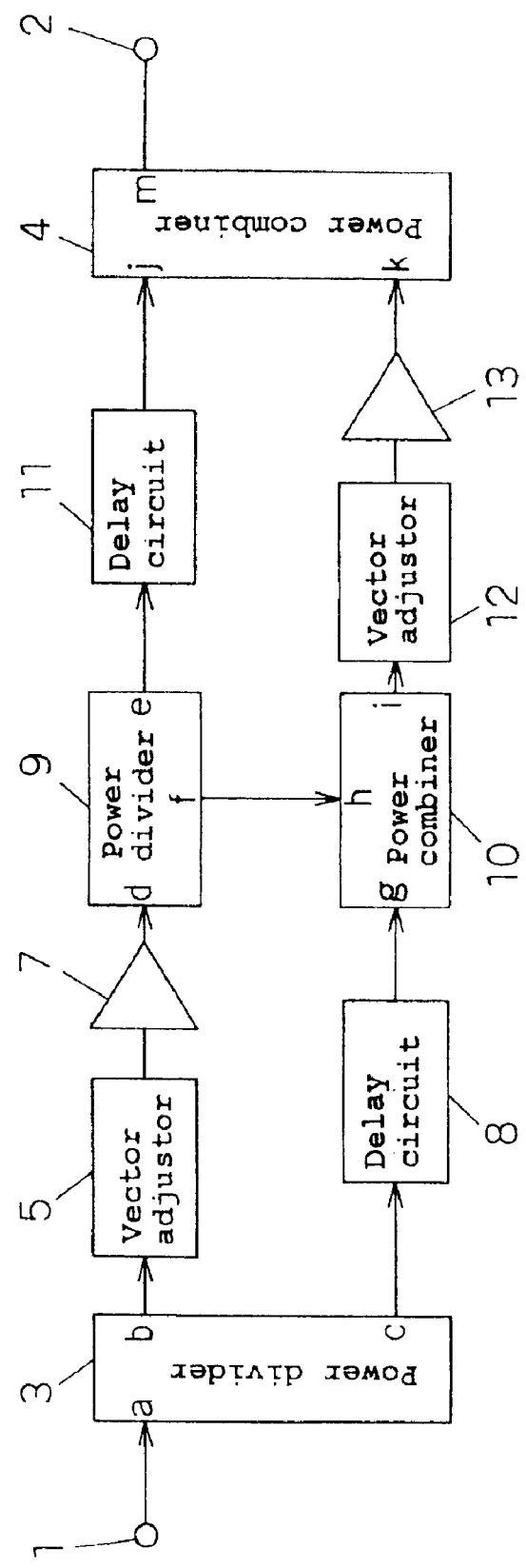
FIG. 12 is a block diagram of a conventional feedforward amplifier.
Figure 13:
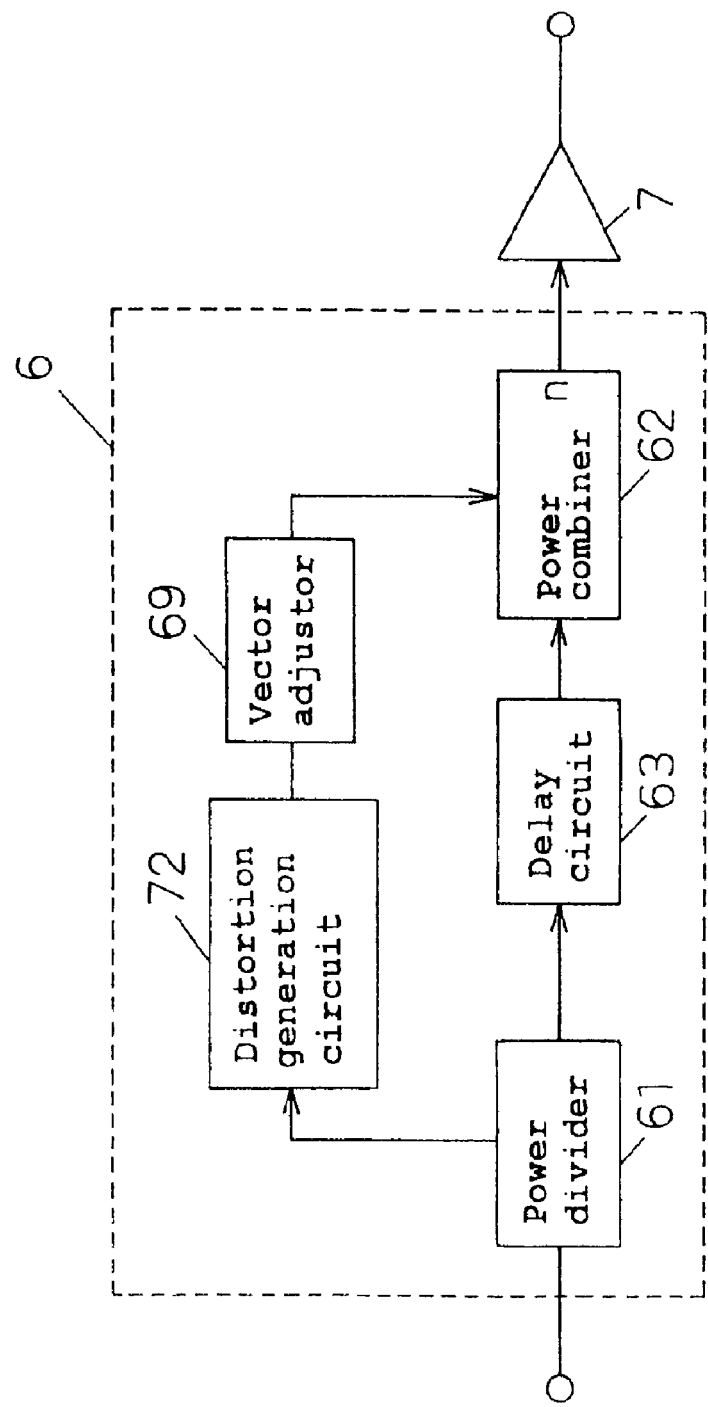
FIG. 13 is a block diagram of a pre-distortion circuit.

It is also possible to consider a circuit configuration shown in FIG. 11, which illustrates another circuit configuration using all or some of the delay lines making up a feedforward circuit for the delay lines making up the pre-distortion circuit. This will also be explained below.

In FIG. 11, the power dividers 3, 64 and 75, power combiners 62 and 65, delay lines 63 and 66, vector adjustors 67 and 69, and distortion generation power amplifier 68 constitute a pre-distortion circuit 6D. Furthermore, the delay lines 63 and 76 constitute a delay line 8' as a delay circuit.

Here, only the principles of operation of the pre-distortion circuit 6D will also be explained.

An input signal including a plurality of carrier frequency components input from the input terminal 1 is input to port a of the power divider 3. The signal input to the port a of the power divider 3 is divided into two portions and output from port b and port c, respectively.

The signal output from the port b is divided into two portions at the power divider 64 and one portion of the output signal divided by two is passed through the vector adjustor 67, amplified by the distortion generation power amplifier 68 and input to the power combiner 65. The other portion of the output signal divided by two is passed through the delay line 66, input to the power combiner 65 and combined with the output signal from the distortion generation power amplifier 68. Here, by adjusting the vector adjustor 67 and delay line 66 so that the carrier frequency components of both signals have the same amplitude and opposite phases, the power combiner 65 outputs a signal including at least the distortion components of the frequency band to be subjected to distortion compensation by the pre-distortion circuit 6D with the carrier frequency components canceled out. The signal output from the power combiner 65 is passed through the vector adjustor 69 and input to the power combiner 62.

The signal output from the port c is passed through the delay line 63 and power divider 75, input to the power combiner 62 and combined with the output signal from the aforementioned vector adjustor 69. The vector adjustor 69 is adjusted so that the distortion component of the main amplifier 7 generated in the frequency band to be subjected to distortion compensation is suppressed to a maximum degree.

The signal combined at the power combiner 62 is output from port n.

Thus, by adopting the circuit configurations in FIGS. 10 and 11, it is possible to reduce the number of components of the circuit.

Embodiment 5 above has described the configuration using the delay line as the delay circuit, but the present invention is not limited to this and it is also possible to use another configuration having a delay function.

Embodiments 1 to 5 have been explained in detail so far.

The present invention also includes a communication apparatus used, for example, for a base station apparatus of mobile communication equipment using the feedforward amplifier of the present invention.

Furthermore, the above-described embodiment performs distortion suppression according to a feedforward system mainly on the band on the high frequency side and compensation according to a pre-distortion system for the band on the low frequency side. However, the present invention is not limited to this and it is also possible to perform distortion suppression according to a feedforward system mainly on the band on the low frequency side and compensation for the band on the high frequency side according to a pre-distortion system. In short, the second vector adjustor of the present invention only needs to be adjusted so that (1) suppression is performed on only (the level of) the distortion component generated within a predetermined frequency range out of the range of frequencies to be suppressed in which distortion components to be suppressed occur or (2) the suppression of (the level of) the distortion component generated within the predetermined frequency range is greater than the suppression of (the level of) the distortion component generated within the frequency range other than the predetermined frequency range out of the range of frequencies to be suppressed, and the pre-distortion compensation circuit of the present invention is adjusted so that at least (the level of) the distortion component generated within the frequency range other than the predetermined frequency range is suppressed.

However, since drastic distortion suppression according to a pre-distortion system is often difficult, it is often the case that more effective suppression can be performed if (1) distortion suppression according to a feedforward system is performed mainly on the band with a high distortion level and (2) distortion suppression according to a pre-distortion system is performed mainly on the band with a low distortion level.

Furthermore, in the above-described embodiment, distortion suppression is performed on both the high frequency side and the low frequency side where distortion occurs using both the feedforward system and pre-distortion system. However, the present invention is not limited to this, and if it is known beforehand that, for example, distortion occurs concentrated either on the high frequency side or low frequency side and the distortion level on the other side is as small as negligible, it is also possible to consider a distortion suppression system that distortion suppression is performed only on the above-described one side where substantial distortion occurs. In short, the second vector adjustor of the present invention needs only to be adjusted so that (1) suppression is performed on only (the level of) the distortion component generated within a predetermined frequency range out of the range of frequencies to be suppressed in which distortion components to be suppressed occur or (2) the suppression of (the level of) the distortion component generated within the predetermined frequency range is greater than the suppression of (the level of) the distortion component generated within the frequency range other than the predetermined frequency range out of the range of frequencies to be suppressed.

Whether the higher distortion level is on the higher frequency side or on the lower frequency side mainly depends on the circuit configuration of the feedforward amplifier, but may also depend on an input signal input from the input terminal. Considering such a case, it is also possible to provide switching means of selecting distortion suppression on which side to be performed according to which system depending on the input signal. Of course, as shown above, even if distortion suppression is performed only according to a feedforward system, it is also possible to provide switching means of detecting the frequency range in which substantial distortion occurs and performing changeover to suppress distortion within the detected frequency range.

Figure 14:
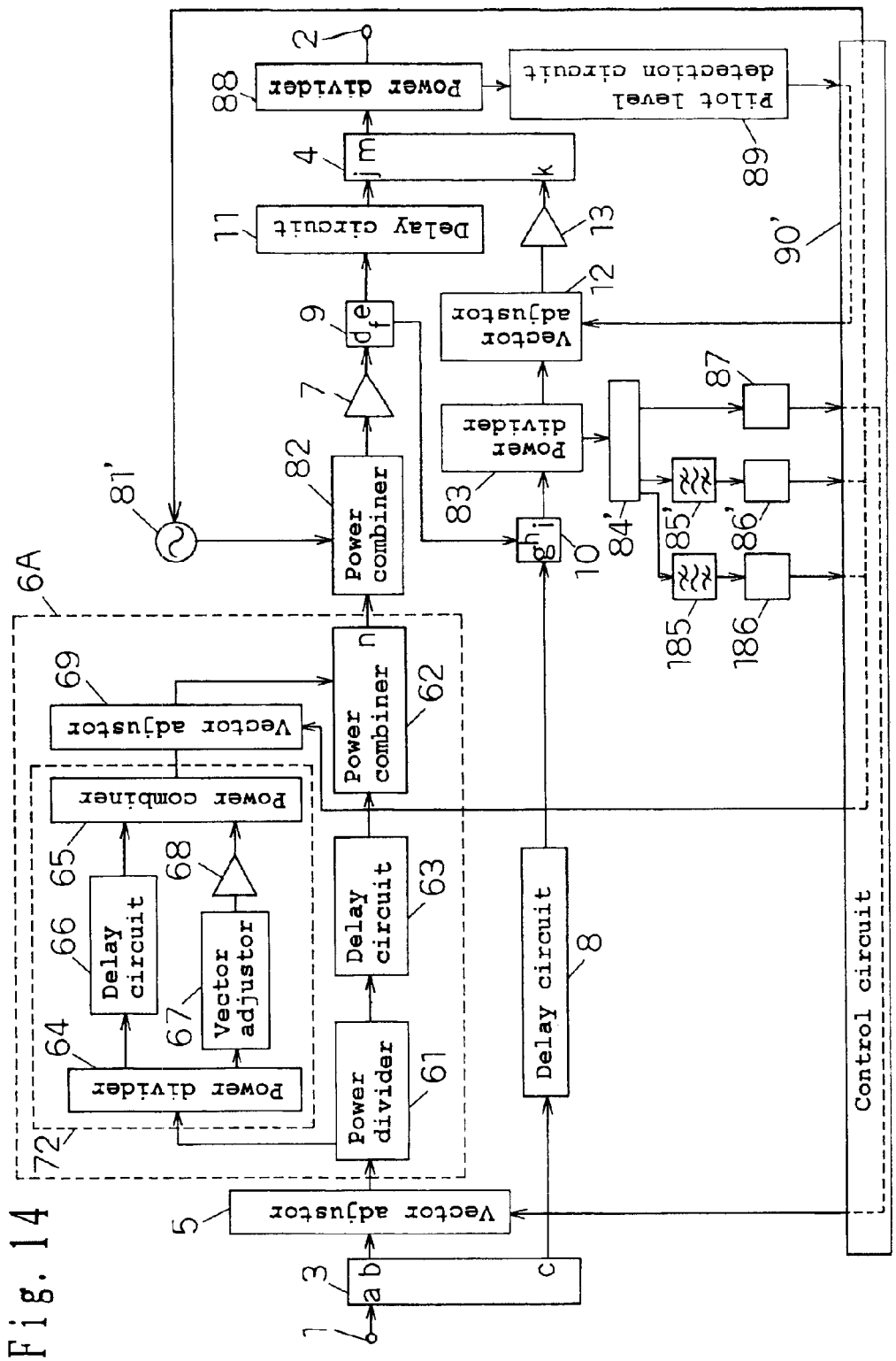
FIG. 14 is a block diagram of a feedforward amplifier capable of selecting which distortion suppression should be performed according to which method, of the present invention.

For example, it is also possible to make adjustments so that the distortion component generated within a predetermined frequency range is greater than the distortion component generated within the frequency range other than the predetermined frequency range out of the distortion components to be suppressed using the circuit configuration of the feedforward amplifier shown in FIG. 14. FIG. 14 is a block diagram of a feedforward amplifier capable of selecting which distortion suppression should be performed according to which system.

More specifically, the feedforward amplifier shown in FIG. 14 has a configuration similar to that of the feedforward amplifier of aforementioned Embodiment 2 (see FIG. 3), and is characterized by including a pilot signal oscillator 81' which is adjustable so that the oscillation frequency falls in the vicinity of a predetermined frequency range, a power divider (fourth power divider) 84' which divides the other portion of the output signal of a power divider 83, which inputs one portion of the output signal to a vector adjustor 12, into three portions, a low frequency side distortion signal band pass filter 85' connected to the first output terminal of the power divider 84', a low frequency side distortion level detection circuit 86' that detects the signal level of the output signal of the low frequency side distortion signal band pass filter, a high frequency side distortion signal band pass filter 185 connected to the second output terminal of the power divider 84', a high frequency side distortion level detection circuit 186 that detects the signal level of the output signal of the high frequency side distortion signal bandpass filter 185, and a control circuit (control means) 90' that automatically adjusts (1) the pre-distortion circuit 6A and pilot signal oscillator 81' according to the signal levels detected at the low frequency side distortion level detection circuit 86' and the signal levels detected at the high frequency side distortion level detection circuit 186, (2) the vector adjustor 5 according to the signal level detected at the carrier level detection circuit 87 and (3) the vector adjustor 12 according to the signal level detected at the pilot level detection circuit 89.

For example, when the signal level detected at the low frequency side distortion level detection circuit 86' is greater than the signal level detected at the high frequency side distortion level detection circuit 186, the vector adjustor 69 of the pre-distortion circuit 6A is adjusted so that the signal level detected at the high frequency side distortion level detection circuit 186 reaches a minimum and the pilot signal oscillator 81' is adjusted so as to fall in the vicinity of the low frequency side and then the vector adjustor 12 is adjusted according to the signal level detected at the pilot level detection circuit 89.

In short, by automatically adjusting the pre-distortion compensation circuit and pilot signal oscillator, (a) when the signal level detected at the low frequency side distortion level detection circuit is greater than the signal level detected at the high frequency side distortion level detection circuit, in such a way that a predetermined frequency range becomes the frequency range corresponding to the low frequency side and (b) when the signal level detected at the high frequency side distortion level detection circuit is greater than the signal level detected at the low frequency side distortion level detection circuit, in such a way that a predetermined frequency range becomes the frequency range corresponding to the high frequency side, it is possible to perform effective distortion suppression taking advantage of the respective characteristics of the aforementioned feedforward system and pre-distortion system. The signal frequency spectra at the respective ports are as shown in FIGS. 15(a) to 15(e) in the first case and FIGS. 2(a) to 2(e) in the latter case as in the above-described case of Embodiment 2 (the distortion input by the pre-distortion circuit 6 differs between the two cases).

Furthermore, the present invention is a program for allowing a computer to execute the functions of all or some means (or apparatuses, elements, circuits, sections, etc.) of the feedforward amplifier and communication apparatus, and is a program that operates in cooperation with the computer. Of course, the computer of the present invention is not limited to genuine hardware such as a CPU, but can also be firmware, OS or can include peripheral devices.

Furthermore, the present invention is a program for allowing a computer to execute the operations of all or some steps (or processes, operations, actions, etc.) of the feedforward amplification method of the aforementioned embodiments and is a program that operates in cooperation with the computer.

Some means (or apparatuses, elements, circuits, sections, etc.) of the present invention and some steps (or processes, operations, actions, etc.) of the present invention refer to some means or steps within a plurality of means or steps or refer to some functions or some operations within one means or step.

Furthermore, some apparatuses (or elements, circuits, sections, etc.) of the present invention refer to some of a plurality of apparatuses or refer to some means (or elements, circuits, sections, etc.) within one apparatus or refer to some functions within one means.

Furthermore, a computer-readable recording medium that records the program of the present invention is also included in the present invention. Furthermore, the mode of using the program of the present invention may also be a mode in which the program is recorded in a computer-readable recording medium and operates in cooperation with the computer. Furthermore, the mode of using the program of the present invention may also be a mode in which the program is transmitted through a transmission medium, read by a computer and operates in cooperation with the computer. Furthermore, examples of the recording medium include ROM, etc., and examples of transmission medium include a transmission medium such as the Internet, light, radio wave and sound wave, etc.

The configuration of the present invention may be implemented by software or by hardware.

Furthermore, the present invention is a medium that carries a program for allowing a computer to execute the functions of all or some means of the feedforward amplifiers and communication apparatus of the aforementioned embodiments and is a medium whereby the computer-readable program and the program read by a computer executes the above-described functions in cooperation with the computer.

Furthermore, the present invention is a medium that carries a program for allowing a computer to execute all or some operations in all or some steps of the feedforward amplification method of the aforementioned embodiments and is a medium whereby the computer-readable program and the program read by a computer executes the operations in cooperation with the computer.

Thus, if either the distortion component generated on the high frequency side or low frequency side of the carrier band is mainly suppressed according to a feedforward system and the resulting deterioration in the amount of distortion suppression on the opposite side is compensated according to a pre-distortion system, it is possible to narrow the distortion compensation range according to pre-distortion system, suppress the distortion component efficiently and improve the amount of distortion suppression as a consequence.

During low output, the level of distortion generated at the main amplifier is low, and therefore it is possible to carry out distortion suppression only according to a pre-distortion system, then stop the operation of the auxiliary amplifier 13 and thereby improve the efficiency during low output.

Furthermore, using all or part of the delay circuit 8 making up the feedforward circuit as the delay circuit making up the pre-distortion circuit 6 makes it possible to reduce the number of components of the circuit.

As is apparent from the above explanations, the present invention has an advantage of providing a feedforward amplifier and communication apparatus capable of efficiently suppressing distortion components.

What is claimed is:

1. A feedforward amplifier comprising:
    a first power divider that divides an input signal into two portions;
    a first vector adjustor that adjusts the amplitude and phase of one portion of the output signal of said first power divider;
    a pre-distortion compensation circuit connected to said first vector adjustor;
    a main amplifier to amplify the output signal of said pre-distortion compensation circuit;
    a second power divider that divides the output signal of said main amplifier into two portions;
    a first delay circuit that delays the other portion of the output signal of said first power divider;
    a distortion detection power combiner that combines the one portion of the output signal of said second power divider and the output signal of said first delay circuit;
    a second delay circuit that delays the other portion of the output signal of said second power divider;
    a second vector adjustor that adjusts the amplitude and phase of the output signal of said distortion detection combiner;
    an auxiliary amplifier that amplifies the output signal of said second vector adjustor; and
    a distortion elimination power combiner that combines the output signal of said second delay circuit and the output signal of said auxiliary amplifier,
    wherein said second vector adjustor is adjusted so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed, and
    said pre-distortion compensation circuit is adjusted so that suppression is performed on at least the distortion component generated within the frequency range other than said predetermined frequency range.

2. The feedforward amplifier according to claim 1, wherein said predetermined frequency range is the entire distortion signal band on the high frequency side or low frequency side generated at said main amplifier.

3. The feedforward amplifier according to claim 1, wherein said pre-distortion compensation circuit is provided between said first power divider and said first vector adjustor.

4. The feedforward amplifier according to claim 1, comprising:
    at least one pilot signal oscillator;
    a first power combiner that combines the output signal of said pilot signal oscillator and the output signal of said pre-distortion compensation circuit and outputs the combined signal to said main amplifier;
    a third power divider that divides the output signal of said distortion detection power combiner into two portions and inputs the one portion of the output signal to said second vector adjustor;
    a fourth power divider that divides the other portion of the output signal of said third power divider into two portions;
    a band pass filter connected to one output terminal of said fourth power divider;
    a distortion level detection circuit that detects the signal level of the output signal of said band pass filter;
    a carrier level detection circuit that detects the signal level of the other portion of the output signal of said fourth power divider;
    a fifth power divider that divides the output signal of said distortion elimination power combiner into two portions;
    a pilot level detection circuit that detects the signal level of one portion of the output signal of said fifth power divider; and
    control means of automatically adjusting (1) said pre-distortion compensation circuit according to the signal level detected at said distortion level detection circuit, (2) said first vector adjustor according to the signal level detected at said carrier level detection circuit and (3) said second vector adjustor according to the signal level detected at said pilot level detection circuit,
    wherein the other portion of the output signal of said fifth power divider is supplied to the subsequent section.

5. The feedforward amplifier according to claim 1, comprising:
    a third power divider that divides the output signal of said distortion detection power combiner into two portions and inputs the one portion of the output signal to said second vector adjustor;
    a fourth power divider that divides the other portion of the output signal of said third power divider into two portions;

a band pass filter connected to one output terminal of said fourth power divider;

a switch circuit that selects and switches between the output signal of said band pass filter and the other portion of the output signal of said fourth power divider according to a control signal from said control means;

a signal level detection circuit that detects the signal level of said selected signal out of the output signal of said band pass filter and the other portion of the output signal of said fourth power divider; and control means of automatically adjusting, based on the signal level detected at said signal level detection circuit, (1) said pre-distortion compensation circuit when the output signal of said band pass filter is selected and (2) said first vector adjustor when the other portion of the output signal of said fourth power divider is selected, respectively.

6. The feedforward amplifier according to claim 4, wherein said control means stops the operation of said auxiliary amplifier or the function of said pre-distortion compensation circuit based on a predetermined condition.

7. The feedforward amplifier according to claim 6, comprising input signal level detecting means of detecting the signal level of said input signal, wherein stopping the operation of said auxiliary amplifier or the function of said pre-distortion compensation circuit based on said predetermined condition means that said control means stops the operation of said auxiliary amplifier when the signal level of said detected input signal is equal to or lower than a predetermined value.

8. The feedforward amplifier according to claim 6, comprising input signal level detecting means of detecting the signal level of said input signal, wherein stopping the operation of said auxiliary amplifier or the function of said pre-distortion compensation circuit based on said predetermined condition means that said control means stops the function of said pre-distortion compensation circuit when the signal level of said detected input signal is equal to or lower than a predetermined value.

9. The feedforward amplifier according to claim 6, comprising input signal level detecting means of detecting the signal level of said input signal, wherein stopping the operation of said auxiliary amplifier or the function of said pre-distortion compensation circuit based on said predetermined condition means that said control means (1) stops the function of said pre-distortion compensation circuit when the signal level of said detected input signal is equal to or lower than a first predetermined value and higher than a second predetermined value which is a value lower than said first predetermined value and (2) stops the operation of said auxiliary amplifier when the signal level of said input signal is equal to or lower than said second predetermined value.

10. The feedforward amplifier according to claim 6, comprising:

a transmission line placed in parallel to said pre-distortion compensation circuit; and first and second switch circuits, placed on the input side of said pre-distortion compensation circuit and said transmission line and on the output side of said pre-distortion compensation circuit and said transmission line, respectively to perform switching on said pre-distortion compensation circuit side and on said transmission line side, wherein stopping the function of said pre-distortion compensation circuit means connecting said first and second switch circuits to said transmission line side.

11. The feedforward amplifier according to one of any of claims 7 to 9, wherein said input signal level detecting means is provided on a signal line including the input signal component.

12. The feedforward amplifier according to one of any of claims 1 to 10, wherein said pre-distortion compensation circuit comprising:

a sixth power divider that divides a signal into two portions;

a distortion generation circuit that generates distortion by inputting one portion of the output signal of said sixth power divider;

a third vector adjustor that adjusts the amplitude and phase of the output signal of said distortion generation circuit;

a third delay circuit that delays the other portion of the output signal of said sixth power divider; and a second power combiner that combines the output signal of said third vector adjustor and the output signal of said third delay circuit.

13. The feedforward amplifier according to claim 12, wherein said distortion generation circuit comprising:

a seventh power divider that divides a signal into two portions;

a fourth vector adjustor that adjusts the amplitude and phase of one portion of the output signal of said seventh power divider;

a distortion generation power amplifier that amplifies the output signal of said fourth vector adjustor;

a fourth delay circuit that delays the other portion of the output signal of said seventh power divider; and a third power combiner that combines the output signal of said distortion generation power amplifier and the output of said fourth delay circuit.

14. The feedforward amplifier according to claim 12, wherein automatically adjusting said pre-distortion compensation circuit according to the signal level detected by said distortion level detection circuit means adjusting the amplitude and phase of said third vector adjustor.

15. The feedforward amplifier according to claim 12, wherein stopping the function of said pre-distortion compensation circuit means that the output signal from said distortion generation circuit is not input to said second power combiner.

16. The feedforward amplifier according to claim 12, wherein said distortion generation circuit is constructed of only a distortion generation power amplifier for amplifying an input signal.

17. The feedforward amplifier according to claim 12, wherein said third delay circuit is constructed using all or part of said first delay circuit.

18. The feedforward amplifier according to claim 13, wherein said fourth delay circuit is constructed using all or part of said first delay circuit.

19. The feedforward amplifier according to claim 13, wherein said distortion generation power amplifier is constructed of a non-linear device.

20. The feedforward amplifier according to claim 1, wherein the distortion component generated within said predetermined frequency range is greater than distortion components generated in a frequency range other than said predetermined frequency range.

21. The feedforward amplifier according to claim 1, wherein an adjustment is made so that the distortion component out of said distortion components to be suppressed, which is generated within the predetermined frequency range is greater than distortion components generated in a frequency range other than the predetermined frequency range.

22. The feedforward amplifier according to claim 21, comprising:
- a pilot signal oscillator adjustable so that an oscillation frequency fails in the vicinity of said predetermined frequency range;
- a first power combiner that combines the output signal of said pilot signal oscillator and the output signal of said pre-distortion compensation circuit and outputs the combined signal to said main amplifier;
- a third power divider that divides the output signal of said distortion detection power combiner into two portions and inputs one portion of the output signal to said second vector adjustor;
- a fourth power divider that divides the other portion of the output signal of said third power divider into three portions;
- a low frequency side distortion signal band pass filter connected to the first output terminal of said fourth power divider;
- a low frequency side distortion level detection circuit that detects the signal level of the output signal of said low frequency side distortion signal band pass filter;
- a high frequency side distortion signal band pass filter connected to the second output terminal of said fourth power divider;
- a high frequency side distortion level detection circuit that detects the signal level of the output signal of said high frequency side distortion signal band pass filter;
- a carrier level detection circuit that detects the signal level of the third output signal of said fourth power divider;
- a fifth power divider that divides the output signal of said distortion elimination power combiner into two portions;
- a pilot level detection circuit that detects the signal level of the other portion of the output signal of said fifth power divider; and
- control means of automatically adjusting (1) said pre-distortion compensation circuit and pilot signal oscillator according to the signal level detected at said low frequency side distortion level detection circuit and the signal level detected at said high frequency side distortion level detection circuit, (2) said first vector adjustor according to the signal level detected at said carrier level detection circuit and (3) said second vector adjustor according to the signal level detected at said pilot level detection circuit, respectively,
- wherein the other portion of the output signal of said fifth power divider is supplied to the subsequent section.

23. The feedforward amplifier according to claim 22, wherein said pre-distortion compensation circuit and pilot signal oscillator are automatically adjusted (a) when the signal level detected at said low frequency side distortion level correction circuit is greater than the signal level detected at said high frequency side distortion level detection circuit, in such a way that said predetermined frequency range becomes the frequency range corresponding to said low frequency side and (b) when the signal level detected at said high frequency side distortion level detection circuit is greater than the signal level detected at said low frequency side distortion level detection circuit, in such a way that said predetermined frequency range becomes the frequency range corresponding to said high frequency side.

24. A feedforward amplifier comprising:
- a first power divider that divides an input signal into two portions;
- a first vector adjustor that adjusts the amplitude and phase of one portion of the output signal of said first power divider;
- a main amplifier to amplify the output signal of said first vector adjustor;
- a second power divider that divides the output signal of said main amplifier into two portions;
- a first delay circuit that delays the other portion of the output signal of said first power divider;
- a distortion detection power combiner that combines the one portion of the output signal of said second power divider and the output signal of said first delay circuit;
- a second delay circuit that delays the other portion of the output signal of said second power divider;
- a second vector adjustor that adjusts the amplitude and phase of the output signal of said distortion detection combiner;
- an auxiliary amplifier that amplifies the output signal of said second vector adjustor; and
- a distortion elimination power combiner that combines the output signal of said second delay circuit and the output signal of said auxiliary amplifier,
- wherein said second vector adjustor is adjusted so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

25. A communication apparatus using the feedforward amplifier according to one of any of claims 1 to 10 and 20 to 24.

26. A feedforward amplification method comprising:
- (a) a step of dividing an input signal into two portions;
- (b) a step of adjusting the amplitude and phase of one portion of the output signal of step (a);
- (c) a step of amplifying the output signal of a pre-distortion compensation circuit;
- (d) a step of dividing the output signal of step (c) into two portions;
- (e) a step of delaying the other portion of the output signal of step (a);
- (f) a step of combining the one portion of the output signal of step (d) and the output signal of step (e);
- (g) a step of delaying the other portion of the output signal of step (d);
- (h) a step of adjusting the amplitude and phase of the output signal of a distortion detection combiner;
- (i) a step of amplifying the output signal of step (h);
- (j) a step of combining the output signal of step (g) and the output signal of step (I);
- (k) a step of adjusting step (h) so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed; and (l) a step of adjusting said pre-distortion compensation circuit so that at least the distortion component generated in a frequency range other than said predetermined frequency range is suppressed.

27. A feedforward amplification method comprising:
(a) a step of dividing an input signal into two portions;
(b) a step of adjusting the amplitude and phase of one portion of the output signal of step (a);
(c) a step of amplifying the output signal of step (b);
(d) a step of dividing the output signal of step (c) into two portions;
(e) a step of delaying the other portion of the output signal of step (a);
(f) a step of combining the one portion of the output signal of step (d) and the output signal of step (e);
(g) a step of delaying the other portion of the output signal of step (d);
(h) a step of adjusting the amplitude and phase of the output signal of a distortion detection combiner;
(i) a step of amplifying the output signal of step (h);
(j) a step of combining the output signal of step (g) and the output signal of step (i); and
(k) a step of adjusting step (h) so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

28. A program for allowing a computer to execute all or some of the steps of the feedforward amplification method according to claim 26, comprising:
(a) a step of dividing an input signal into two portions;
(b) a step of adjusting the amplitude and phase of one portion of the output signal of step (a);
(c) a step of amplifying the output signal of a pre-distortion compensation circuit;
(d) a step of dividing the output signal of step (c) into two portions;
(e) a step of delaying the other portion of the output signal of step (a);
(f) a step of combining the one portion of the output signal of step (d) and the output signal of step (e);
(g) a step of delaying the other portion of the output signal of step (d);
(h) a step of adjusting the amplitude and phase of the output signal of a distortion detection combiner;
(i) a step of amplifying the output signal of step (h);
(j) a step of combining the output signal of step (g) and the output signal of step (i);
(k) a step of adjusting step (h) so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed; and
(l) a step of adjusting said pre-distortion compensation circuit so that at least the distortion component generated in a frequency range other than said predetermined frequency range is suppressed.

29. A computer-processable medium that stores a program for allowing a computer to execute all or some of the steps of the feedforward amplification method according to claim 26, comprising:
(a) a step of dividing an input signal into two portions;
(b) a step of adjusting the amplitude and phase of one portion of the output signal of step (a);
(c) a step of amplifying the output signal of a pre-distortion compensation circuit;
(d) a step of dividing the output signal of step (c) into two portions;
(e) a step of delaying the other portion of the output signal of step (a);
(f) a step of combining the one portion of the output signal of step (d) and the output signal of step (e);
(g) a step of delaying the other portion of the output signal of step (d);
(h) a step of adjusting the amplitude and phase of the output signal of a distortion detection combiner;
(i) a step of amplifying the output signal of step (h);
(j) a step of combining the output signal of step (g) and the output signal of step (i);
(k) a step of adjusting step (h) so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed; and
(l) a step of adjusting said pre-distortion compensation circuit so that at least the distortion component generated in a frequency range other than said predetermined frequency range is suppressed.

30. A program for allowing a computer to execute all or some of the steps of the feedforward amplification method according to claim 27, comprising:
(a) a step of dividing an input signal into two portions;
(b) a step of adjusting the amplitude and phase of one portion of the output signal of step (a);
(c) a step of amplifying the output signal of step (b);
(d) a step of dividing the output signal of step (c) into two portions;
(e) a step of delaying the other portion of the output signal of step (a);
(f) a step of combining the one portion of the output signal of step (d) and the output signal of step (e);

(g) a step of delaying the other portion of the output signal of step (d);
(h) a step of adjusting the amplitude and phase of the output signal of a distortion detection combiner;
(i) a step of amplifying the output signal of step (h);
(j) a step of combining the output signal of step (g) and the output signal of step (i); and
(k) a step of adjusting step (h) so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

31. A computer-processable medium that stores a program for allowing a computer to execute all or some of the steps of the feedforward amplification method according to claim 27, comprising:
(a) a step of dividing an input signal into two portions;
(b) a step of adjusting the amplitude and phase of one portion of the output signal of step (a);
(c) a step of amplifying the output signal of step (b);
(d) a step of dividing the output signal of step (c) into two portions;
(e) a step of delaying the other portion of the output signal of step (a);
(f) a step of combining the one portion of the output signal of step (d) and the output signal of step (e);
(g) a step of delaying the other portion of the output signal of step (d);
(h) a step of adjusting the amplitude and phase of the output signal of a distortion detection combiner;
(i) a step of amplifying the output signal of step (h);
(j) a step of combining the output signal of step (g) and the output signal of step (i); and
(k) a step of adjusting step (h) so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed.

32. A feedforward amplifier comprising:
a first power divider that divides an input signal into two portions;
a first vector adjustor that adjusts the amplitude and phase of one portion of the output signal of said first power divider;
a main amplifier to amplify the output signal of said first vector adjustor;
a second power divider that divides the output signal of said main amplifier into two portions;
a first delay circuit that delays the other portion of the output signal of said first power divider;
a distortion detection power combiner that combines the one portion of the output signal of said second power divider and the output signal of said first delay circuit;
a second delay circuit that delays the other portion of the output signal of said second power divider;
a second vector adjustor that adjusts the amplitude and phase of the output signal of said distortion detection combiner;
an auxiliary amplifier that amplifies the output signal of said second vector adjustor; and
a distortion elimination power combiner that combines the output signal of said second delay circuit and the output signal of said auxiliary amplifier,
wherein an adjustment is made so that the distortion component out of said distortion components to be suppressed, which is generated within the predetermined frequency range is greater than distortion components generated in a frequency range other than the predetermined frequency range; and further comprising:
a pilot signal oscillator adjustable so that an oscillation frequency falls in the vicinity of said predetermined frequency range;
a first power combiner that combines the output signal of said pilot signal oscillator and the output signal of said pre-distortion compensation circuit and outputs the combined signal to said main amplifier;
a third power divider that divides the output signal of said distortion detection power combiner into two portions and inputs one portion of the output signal to said second vector adjustor;
a fourth power divider that divides the other portion of the output signal of said third power divider into three portions;
a low frequency side distortion signal band pass filter connected to the first output terminal of said fourth power divider;
a low frequency side distortion level detection circuit that detects the signal level of the output signal of said low frequency side distortion signal band pass filter;
a high frequency side distortion signal band pass filter connected to the second output terminal of said fourth power divider;
a high frequency side distortion level detection circuit that detects the signal level of the output signal of said high frequency side distortion signal band pass filter;
a carrier level detection circuit that detects the signal level of the third output signal of said fourth power divider;
a fifth power divider that divides the output signal of said distortion elimination power combiner into two portions;
a pilot level detection circuit that detects the signal level of the other portion of the output signal of said fifth power divider; and
control means of automatically adjusting (1) said pre-distortion compensation circuit and pilot signal oscillator according to the signal level detected at said low frequency side distortion level detection circuit and the signal level detected at said high frequency side distortion level detection circuit, (2) said first vector adjustor according to the signal level detected at said carrier level detection circuit and (3) said second vector adjustor according to the signal level detected at said pilot level detection circuit, respectively,
wherein the other portion of the output signal of said fifth power divider is supplied to the subsequent section.

33. A feedforward amplification method comprising the steps of:

(a) dividing an input signal into two portions of a first output signal;

(b) adjusting amplitude and phase of one portion of the first output signal of step (a) to provide a first adjusted output signal;

(c) amplifying the first adjusted output signal of step (b) to provide a first amplified output signal;

(d) dividing the first amplified output signal of step (c) into two portions of a second output signal;

(e) delaying the other portion of the first output signal of step (a) to provide a first delayed output signal;

(f) combining one portion of the second output signal of step (d) and the first delayed output signal of step (e) to provide a first combined signal;

(g) delaying the other portion of the second output signal of step (d) to provide a second delayed output signal;

(h) adjusting amplitude and phase of the first combined signal of step (f) to provide a second adjusted output signal;

(i) amplifying the second adjusted output signal of step (h) to provide a second amplified output signal;

(j) combining the second delayed output signal of step (g) and the second amplified output signal of step (i);

(k) further adjusting step (h) so that (1) suppression is performed on only the distortion component generated within a predetermined frequency range out of the range of frequencies to be suppressed in which distortion components to be suppressed occur or (2) the suppression of the distortion component generated within said predetermined frequency range is greater than the suppression of the distortion component generated within the frequency range other than said predetermined frequency range out of said range of frequencies to be suppressed; and (l) further adjusting step (b) so that at least the distortion component generated in a frequency range other than said predetermined frequency range is suppressed.

* * * * *

UNITED STATES PATENT AND TRADEMARK OFFICE
CERTIFICATE OF CORRECTION

PATENT NO. : 6,940,346 B2
DATED : September 6, 2005
INVENTOR(S) : Masayuki Miyaji et al.

It is certified that error appears in the above-identified patent and that said Letters Patent is hereby corrected as shown below:

Column 29,
Line 11, change "fails" to -- falls --.
Line 60, change "correction" to -- detection --.

Column 30,
Line 62, change "(I)" to -- (i) --.

Signed and Sealed this

Fourth Day of April, 2006

JON W. DUDAS
*Director of the United States Patent and Trademark Office*